(12) United States Patent
Jiang et al.

(10) Patent No.: US 10,794,545 B2
(45) Date of Patent: Oct. 6, 2020

(54) LED LIGHT BULB WITH SEGMENTED LED FILAMENT

(71) Applicant: ZHEJIANG SUPER LIGHTING ELECTRIC APPLIANCE CO.,LTD, Zhejiang (CN)

(72) Inventors: Tao Jiang, Zhejiang (CN); Wei-Hong Xu, Zhejiang (CN); Yukihiro Saito, Zhejiang (CN); Hayato Unagiike, Zhejiang (CN); Al-Ming Xiong, Zhejiang (CN); Jun-Feng Xu, Zhejiang (CN); Yi-Ching Chen, Taichung (TW)

(73) Assignee: ZHEJIANG SUPER LIGHTING ELECTRIC APPLIANCE CO., LT, Jinyun (CN)

( * ) Notice: Subject to any disclaimer, the term of this patent is extended or adjusted under 35 U.S.C. 154(b) by 0 days.

(21) Appl. No.: 16/432,949

(22) Filed: Jun. 6, 2019

(65) Prior Publication Data
US 2019/0309906 A1    Oct. 10, 2019

Related U.S. Application Data

(63) Continuation of application No. 16/234,124, filed on Dec. 27, 2018, which is a continuation-in-part of
(Continued)

(30) Foreign Application Priority Data

Sep. 28, 2014    (CN) ............... 2014 1 0510593
Feb. 2, 2015    (CN) ............... 2015 1 0053077
(Continued)

(51) Int. Cl.
*F21K 9/232*    (2016.01)
*F21K 9/61*    (2016.01)
(Continued)

(52) U.S. Cl.
CPC .............. *F21K 9/232* (2016.08); *F21K 9/61* (2016.08); *F21V 15/04* (2013.01); *H01L 33/00* (2013.01);
(Continued)

(58) Field of Classification Search
CPC ............................ F21K 9/232; F21K 9/238
See application file for complete search history.

(56) References Cited

U.S. PATENT DOCUMENTS 8,455,895 B2    6/2013    Chai et al.
8,933,619 B1    1/2015    Ou
(Continued)

FOREIGN PATENT DOCUMENTS

CN    102121576 A    7/2011
CN    202252991 U    5/2012
(Continued)

*Primary Examiner* — William N Harris
(74) *Attorney, Agent, or Firm* — Simon Kuang Lu

(57) ABSTRACT

An LED light bulb having a bulb base and a bulb shell connected with the bulb base, the bulb shell having a layer of luminescent material formed in the material of the bulb shell. A stem with a stand extending to the center of the bulb shell is disposed in the bulb shell. A flexible LED filament is disposed in the bulb shell, at least half of the LED filament is disposed around a center axle of the LED light bulb, where the center axle is coaxial with the axle of the stand and two conductive supports, each of which are connected with the stem and the LED filament. A driving circuit is electrically connected with the two conductive supports and the bulb base. Additionally, a plurality of supporting arms has two ends, with one end connected to the stem and the other end connected to the LED filament.

20 Claims, 11 Drawing Sheets

Related U.S. Application Data application No. 15/858,036, filed on Dec. 29, 2017, now Pat. No. 10,544,905, which is a continuation-in-part of application No. 29/627,379, filed on Nov. 27, 2017, now Pat. No. Des. 879,330, and a continuation-in-part of application No. 29/619,287, filed on Sep. 28, 2017, now Pat. No. Des. 862,740, and a continuation-in-part of application No. 15/723,297, filed on Oct. 3, 2017, now Pat. No. 10,655,792, which is a continuation-in-part of application No. 15/168,541, filed on May 31, 2016, now Pat. No. 9,995,474, and a continuation-in-part of application No. 15/308,995, filed as application No. PCT/CN2015/090815 on Sep. 25, 2015, said application No. 15/723,297 is a continuation-in-part of application No. 15/499,143, filed on Apr. 27, 2017, now Pat. No. 10,240,724, which is a continuation-in-part of application No. 15/384,311, filed on Dec. 19, 2016, now Pat. No. 10,487,987, which is a continuation-in-part of application No. 15/366,535, filed on Dec. 1, 2016, now Pat. No. 10,473,271, which is a continuation-in-part of application No. 15/237,983, filed on Aug. 16, 2016, now Pat. No. 10,228,093.

(30) Foreign Application Priority Data

| Date | | Number |
|---|---|---|
| Jun. 10, 2015 | (CN) | 2015 1 0316656 |
| Jun. 19, 2015 | (CN) | 2015 1 0347410 |
| Aug. 7, 2015 | (CN) | 2015 1 0489363 |
| Aug. 17, 2015 | (CN) | 2015 1 0502630 |
| Sep. 2, 2015 | (CN) | 2015 1 0555889 |
| Dec. 19, 2015 | (CN) | 2015 1 0966906 |
| Jan. 22, 2016 | (CN) | 2016 1 0041667 |
| Apr. 27, 2016 | (CN) | 2016 1 0272153 |
| Apr. 29, 2016 | (CN) | 2016 1 0281600 |
| Jun. 3, 2016 | (CN) | 2016 1 0394610 |
| Jul. 7, 2016 | (CN) | 2016 1 0544049 |
| Jul. 22, 2016 | (CN) | 2016 1 0586388 |
| Nov. 1, 2016 | (CN) | 2016 1 0936171 |
| Dec. 6, 2016 | (CN) | 2016 1 1108722 |
| Jan. 13, 2017 | (CN) | 2017 1 0024877 |
| Feb. 14, 2017 | (CN) | 2017 1 0079423 |
| Mar. 9, 2017 | (CN) | 2017 1 0138009 |
| Mar. 23, 2017 | (CN) | 2017 1 0180574 |
| Apr. 11, 2017 | (CN) | 2017 1 0234618 |
| May 8, 2017 | (CN) | 2017 1 0316641 |
| Sep. 18, 2017 | (CN) | 2017 1 0839083 |
| Sep. 21, 2017 | (CN) | 2017 3 0450712 |
| Sep. 22, 2017 | (CN) | 2017 3 0453237 |
| Sep. 22, 2017 | (CN) | 2017 3 0453239 |
| Sep. 26, 2017 | (CN) | 2017 1 0883625 |
| Oct. 16, 2017 | (CN) | 2017 3 0489929 |
| Oct. 27, 2017 | (CN) | 2017 3 0517887 |
| Oct. 30, 2017 | (CN) | 2017 3 0520672 |
| Nov. 3, 2017 | (CN) | 2017 3 0537542 |
| Nov. 3, 2017 | (CN) | 2017 3 0537544 |
| Dec. 26, 2017 | (CN) | 2017 1 1434993 |
| Dec. 29, 2017 | (CN) | 2017 1 1477767 |
| Jan. 12, 2018 | (CN) | 2018 1 0031786 |
| Jan. 23, 2018 | (CN) | 2018 1 0065369 |
| Apr. 17, 2018 | (CN) | 2018 1 0343825 |
| Apr. 17, 2018 | (CN) | 2018 1 0344630 |
| May 23, 2018 | (CN) | 2018 1 0498980 |
| May 23, 2018 | (CN) | 2018 1 0501350 |
| Jun. 6, 2018 | (CN) | 2018 1 0573314 |
| Jul. 26, 2018 | (CN) | 2018 1 0836433 |
| Aug. 17, 2018 | (CN) | 2018 1 0943054 |
| Aug. 30, 2018 | (CN) | 2018 1 1005145 |
| Aug. 30, 2018 | (CN) | 2018 1 1005536 |
| Sep. 17, 2018 | (CN) | 2018 1 1079889 |
| Oct. 30, 2018 | (CN) | 2018 1 1277980 |
| Oct. 31, 2018 | (CN) | 2018 1 1285657 |
| Nov. 19, 2018 | (CN) | 2018 1 1378173 |
| Nov. 19, 2018 | (CN) | 2018 1 1378189 |
| Dec. 18, 2018 | (CN) | 2018 1 1549205 |

(51) Int. Cl.

| | |
|---|---|
| F21V 15/04 | (2006.01) |
| H01L 33/00 | (2010.01) |
| H05B 45/00 | (2020.01) |
| F21Y 115/10 | (2016.01) |
| F21Y 107/70 | (2016.01) |
| H01L 33/50 | (2010.01) |
| H01L 33/54 | (2010.01) |
| H01L 33/62 | (2010.01) |

(52) U.S. Cl.
CPC .......... *H05B 45/00* (2020.01); *F21Y 2107/70* (2016.08); *F21Y 2115/10* (2016.08); *H01L 33/505* (2013.01); *H01L 33/54* (2013.01); *H01L 33/62* (2013.01)

(56) References Cited

U.S. PATENT DOCUMENTS

| | | | |
|---|---|---|---|
| 9,016,900 | B2 | 4/2015 | Takeuchi et al. |
| 9,360,188 | B2 * | 6/2016 | Kircher ............... F21K 9/64 |
| 9,488,767 | B2 | 11/2016 | Nava et al. |
| 9,761,765 | B2 | 9/2017 | Basin et al. |
| 9,982,854 | B2 | 5/2018 | Ma et al. |
| 10,066,791 | B2 * | 9/2018 | Zhang ............... H01L 33/62 |
| 2004/0008525 | A1 | 1/2004 | Shibata |
| 2007/0267976 | A1 * | 11/2007 | Bohler ............... B82Y 10/00 |
| | | | 315/112 |
| 2009/0184618 | A1 | 7/2009 | Hakata et al. |
| 2010/0135009 | A1 * | 6/2010 | Duncan ............... F21V 3/04 |
| | | | 362/231 |
| 2012/0119647 | A1 | 5/2012 | Hsu |
| 2012/0256538 | A1 * | 10/2012 | Takeuchi ............... F21K 9/232 |
| | | | 313/512 |
| 2013/0058080 | A1 | 3/2013 | Ge et al. |
| 2013/0147348 | A1 | 6/2013 | Motoya et al. |
| 2013/0215625 | A1 * | 8/2013 | Takeuchi ............ F21V 23/001 |
| | | | 362/363 |
| 2013/0235592 | A1 | 9/2013 | Takeuchi et al. |
| 2013/0265796 | A1 | 10/2013 | Kwisthout |
| 2013/0293098 | A1 | 11/2013 | Li et al. |
| 2014/0022788 | A1 * | 1/2014 | Dan ............... F21V 3/02 |
| | | | 362/249.02 |
| 2014/0152177 | A1 * | 6/2014 | Matsuda ............. F21K 9/90 |
| | | | 315/32 |
| 2014/0268779 | A1 | 9/2014 | Sorensen et al. |
| 2014/0369036 | A1 | 12/2014 | Feng |
| 2015/0069442 | A1 | 3/2015 | Liu et al. |
| 2015/0070871 | A1 | 3/2015 | Chen et al. |
| 2015/0255440 | A1 | 9/2015 | Hsieh |
| 2016/0238199 | A1 * | 8/2016 | Yeung ............... F21V 3/049 |
| 2016/0369952 | A1 * | 12/2016 | Weekamp ............ F21V 9/32 |
| 2016/0377237 | A1 | 12/2016 | Zhang |
| 2017/0012177 | A1 | 1/2017 | Trottier |
| 2017/0122499 | A1 * | 5/2017 | Lin ............... F21V 29/50 |
| 2017/0167663 | A1 | 6/2017 | Hsiao et al. |

FOREIGN PATENT DOCUMENTS

| | | |
|---|---|---|
| CN | 102751274 A | 10/2012 |
| CN | 202719450 U | 2/2013 |
| CN | 103123949 A | 5/2013 |

(56) References Cited

FOREIGN PATENT DOCUMENTS

| | | |
|---|---|---|
| CN | 203367275 U | 12/2013 |
| CN | 103560128 A | 2/2014 |
| CN | 203628391 U | 6/2014 |
| CN | 203656627 U | 6/2014 |
| CN | 103939758 A | 7/2014 |
| CN | 103956421 A | 7/2014 |
| CN | 103972364 A | 8/2014 |
| CN | 103994349 A | 8/2014 |
| CN | 203857313 U | 10/2014 |
| CN | 203880468 U | 10/2014 |
| CN | 204062539 U | 12/2014 |
| CN | 104295945 A | 1/2015 |
| CN | 104319345 A | 1/2015 |
| CN | 204083941 U | 1/2015 |
| CN | 104456165 A | 3/2015 |
| CN | 204289439 U | 4/2015 |
| CN | 104600174 A | 5/2015 |
| CN | 104600181 A | 5/2015 |
| CN | 204328550 U | 5/2015 |
| CN | 204387765 U | 6/2015 |
| CN | 104913217 A | 9/2015 |
| CN | 105042354 A | 11/2015 |
| CN | 105090789 A | 11/2015 |
| CN | 105140381 A | 12/2015 |
| CN | 105161608 A | 12/2015 |
| CN | 105371243 A | 3/2016 |
| CN | 105609621 A | 5/2016 |
| CN | 106468405 A | 3/2017 |
| CN | 106898681 A | 6/2017 |
| CN | 107123641 A | 9/2017 |
| CN | 107170733 A | 9/2017 |
| CN | 206563190 U | 10/2017 |
| CN | 107314258 A | 11/2017 |
| CN | 206973307 U | 2/2018 |
| CN | 207034659 U | 2/2018 |
| CN | 108039402 A | 5/2018 |
| CN | 105090782 B | 7/2018 |
| CN | 105098032 A | 7/2018 |
| CN | 207849021 U | 9/2018 |
| EP | 2760057 A1 | 7/2014 |
| EP | 2567145 B1 | 4/2016 |
| GB | 2547085 A | 8/2017 |
| JP | 3075689 U | 2/2001 |
| JP | 2001126510 A | 5/2001 |
| JP | 2003037239 A | 2/2003 |
| JP | 2013225587 A | 10/2013 |
| WO | 2014167458 A1 | 10/2014 |
| WO | 2017037010 A1 | 3/2017 |

\* cited by examiner

LED LIGHT BULB WITH SEGMENTED LED FILAMENT

CROSS-REFERENCE TO RELATED APPLICATIONS

This application is a continuation application of U.S. application Ser. No. 16/234,124 filed on 2018 Dec. 27, which claims priority to Chinese Patent Applications No. 201510502630.3 filed on 2015 Aug. 17; No. 201510966906.3 filed on 2015 Dec. 19; No. 201610041667.5 filed on 2016 Jan. 22; No. 201610272153.0 filed on 2016 Apr. 27; No. 201610394610.3 filed on 2016 Jun. 3; No. 201610586388.7 filed on 2016 Jul. 22; No. 201610544049.2 filed on 2016 Jul. 7; No. 201610936171.4 filed on 2016 Nov. 1; No. 201611108722.4 filed on 2016 Dec. 6; No. 201610281600.9 filed on 2016 Apr. 29; No. 201710024877.8 filed on 2017 Jan. 13; No. 201710079423.0 filed on 2017 Feb. 14; No. 201710138009.2 filed on 2017 Mar. 9; No. 201710180574.5 filed on 2017 Mar. 23; No. 201710234618.8 filed on 2017 Apr. 11; No. 201410510593.6 filed on 2014 Sep. 28; No. 201510053077.X filed on 2015 Feb. 2; No. 201510316656.9 filed on 2015 Jun. 10; No. 201510347410.8 filed on 2015 Jun. 19; No. 201510489363.0 filed on 2015 Aug. 7; No. 201510555889.4 filed on 2015 Sep. 2; No. 201710316641.1 filed on 2017 May 8; No. 201710839083.7 filed on 2017 Sep. 18; No. 201710883625.0 filed on 2017 Sep. 26; No. 201730450712.8 filed on 2017 Sep. 21; No. 201730453239.9 filed on 2017 Sep. 22; No. 201730453237.X filed on 2017 Sep. 22; No. 201730537542.7 filed on 2017 Nov. 3; No. 201730537544.6 filed on 2017 Nov. 3; No. 201730520672.X filed on 2017 Oct. 30; No. 201730517887.6 filed on 2017 Oct. 27; No. 201730489929.X filed on 2017 Oct. 16; No. 201711434993.3 filed on 2017 Dec. 26; No. 201711477767.3 filed on 2017 Dec. 29; No. 201810031786.1 filed on 2018 Jan. 12; No. 201810065369.9 filed on 2018 Jan. 23; No. 201810343825.1 filed on 2018 Apr. 17; No. 201810344630.9 filed on 2018 Apr. 17; No. 201810501350.4 filed on 2018 May 23; No. 201810498980.0 filed on 2018 May 23; No. 201810573314.9 filed on 2018 Jun. 6; No. 201810836433.9 filed on 2018 Jul. 26; No. 201810943054.X filed on 2018 Aug. 17; No. 201811005536.7 filed on 2018 Aug. 30; No. 201811005145.5 filed on 2018 Aug. 30; No. 201811079889.1 filed on 2018 Sep. 17; No. 201811277980.4 filed on 2018 Oct. 30; No. 201811285657.1 filed on 2018 Oct. 31; No. 201811378173.1 filed on 2018 Nov. 19; No. 201811378189.2 filed on 2018 Nov. 19; No. 201811549205.X filed on 2018 Dec. 18, each of which is hereby incorporated by reference in its entirety.

TECHNICAL FIELD

The present disclosure relates to a lighting field, and more particularly to an LED light bulb with segmented LED filament.

RELATED ART

Incandescent bulbs have been widely used for homes or commercial lighting for decades. However, incandescent bulbs are generally with lower efficiency in terms of energy application, and about 90% of energy input can be converted into a heat form to dissipate. In addition, because the incandescent bulb has a very limited lifespan (about 1,000 hours), it needs to be frequently replaced. These traditional incandescent bulbs are gradually replaced by other more efficient lighting devices, such as fluorescent lights, high-intensity discharge lamps, light-emitting diodes (LEDs) lights and the like. In these electric lamps, the LED light lamp attracts widespread attention in its lighting technology. The LED light lamp has the advantages of long lifespan, small in size, environmental protection and the like, therefore the application of the LED light lamp continuously grows.

In recent years, LED light bulbs with LED filaments have been provided on the market. At present, LED light bulbs using LED filaments as illumination sources still have the following problems to be improved.

Firstly, an LED hard filament is provided with a substrate (for example, a glass substrate) and a plurality of LED chips disposed on the substrate. However, the illumination appearance of the LED light bulbs relies on multiple combinations of the LED hard filaments to produce the better illumination appearances. The illumination appearance of the single LED hard filament cannot meet the general needs in the market. A traditional incandescent light bulb is provided with a tungsten filament, the uniform light emitting can be generated due to the natural bendable property of the tungsten filament. In contrast, the LED hard filament is difficult to achieve such uniform illumination appearances. There are many reasons why LED hard filaments are difficult to achieve the uniform illumination appearance. In addition to the aforementioned lower bendable property, one of the reasons is that the substrate blocks the light emitted by the LED chip, and furthermore the light generated by the LED chip is displayed similar to a point light source which causes the light showing concentrated illumination and with poor illumination uniformity. In other words, a uniform distribution of the light emitted from LED chip produces a uniform illumination appearance of the LED filament. On the other hand, the light ray distribution similar to a point light source may result in uneven and concentrated illumination.

Secondly, there is one kind of LED soft filament, which is similar to the structure of the above-mentioned LED hard filament and is employed a flexible printed circuit substrate (hereinafter referred to FPC) instead of the glass substrate to enable the LED filament having a certain degree of bending. However, by utilizing the LED soft filament made of the FPC, the FPC has a thermal expansion coefficient different from that of the silicon gel coated covering the LED soft filament, and the long-term use causes the displacement or even degumming of the LED chips. Moreover, the FPC may not beneficial to flexible adjustment of the process conditions and the like. Besides, during bending the LED soft filament it has a challenge in the stability of the metal wire bonded between LED chips. When the arrangement of the LED chips in the LED soft filament is dense, if the adjacent LED chips are connected by means of metal wire bonding, it is easy to cause the stress to be concentrated on a specific part of the LED soft filament when the LED soft filament is bent, thereby the metal wire bonding between the LED chips are damaged and even broken.

In addition, the LED filament is generally disposed inside the LED light bulb, and in order to present the aesthetic appearance and also to make the illumination of the LED filament more uniform and widespread, the LED filament is bent to exhibit a plurality of curves. Since the LED chips are arranged in the LED filaments, and the LED chips are relatively hard objects, it is difficult for the LED filaments to be bent into a desired shape. Moreover, the LED filament is also prone to cracks due to stress concentration during bending.

In order to increase the aesthetic appearance and make the illumination appearance more uniform, an LED light bulb has a plurality of LED filaments, which are disposed with different placement or angles. However, since the plurality of LED filaments need to be installed in a single LED light bulb, and these LED filaments need to be fixed individually, the assembly process will be more complicated and the production cost will be increased.

In addition, since the driving requirements for lighting the LED filament are substantially different from for lighting the conventional tungsten filament lamp. Therefore, for LED light bulbs, how to design a power supply circuitry with a stable current to reduce the ripple phenomenon of the LED filament in an acceptable level so that the user does not feel the flicker is one of the design considerations. Besides, under the space constraints and the premises of achieving the required light efficiency and the driving requirements, how to design a power supply circuitry with the structure simply enough to embed into the space of the lamp head is also a focus of attention.

Patent No. CN202252991U discloses the light lamp employing with a flexible PCB board instead of the aluminum heat dissipation component to improve heat dissipation. Wherein, the phosphor is coated on the upper and lower sides of the LED chip or on the periphery thereof, and the LED chip is fixed on the flexible PCB board and sealed by an insulating adhesive. The insulating adhesive is epoxy resin, and the electrodes of the LED chip are connected to the circuitry on the flexible PCB board by gold wires. The flexible PCB board is transparent or translucent, and the flexible PCB board is made by printing the circuitry on a polyimide or polyester film substrate. Patent No. CN105161608A discloses an LED filament light-emitting strip and a preparation method thereof. Wherein the LED chips are disposed without overlapped, and the light-emitting surfaces of the LED chips are correspondingly arranged, so that the light emitting uniformity and heat dissipation is improved accordingly. Patent No. CN103939758A discloses that a transparent and thermally conductive heat dissipation layer is formed between the interface of the carrier and the LED chip for heat exchange with the LED chip. According to the aforementioned patents, which respectively use a PCB board, adjust the chips arrangement or form a heat dissipation layer, the heat dissipation of the filament of the lamp can be improved to a certain extent correspondingly; however, the heat is easy to accumulate due to the low efficiency in heat dissipation. The last one, Publication No. CN204289439U discloses an LED filament with omnidirectional light comprising a substrate mixed with phosphors, at least one electrode disposed on the substrate, at least one LED chip mounted on the substrate, and the encapsulant coated on the LED chip. The substrate formed by the silicone resin contained with phosphors eliminates the cost of glass or sapphire as a substrate, and the LED filament equipping with this kind of substrate avoids the influence of glass or sapphire on the light emitting of the LED chip. The 360-degree light emitting is realized, and the illumination uniformity and the light efficiency are greatly improved. However, due to the fact that the substrate is formed by silicon resin, the defect of poor heat resistance is a disadvantage.

SUMMARY

It is noted that the present disclosure includes one or more inventive solutions currently claimed or not claimed, and in order to avoid confusion between the illustration of these embodiments in the specification, a number of possible inventive aspects herein may be collectively referred to "present/the invention."

A number of embodiments are described herein with respect to "the invention." However, the word "the invention" is used merely to describe certain embodiments disclosed in this specification, whether or not in the claims, is not a complete description of all possible embodiments. Some embodiments of various features or aspects described below as "the invention" may be combined in various ways to form an LED light bulb or a portion thereof.

In accordance with another embodiment of the present invention, an LED filament comprises at least one LED section, a conductive section, at least two conductive electrodes and a light conversion layer. The conductive section is located between two adjacent LED sections. The two conductive electrodes are electrically connected to the LED sections. The adjacent two LED sections are electrically connected to each other through the conductive section. Each of the conductive sections is electrically connected to the LED section by at least one wire.

In accordance with an embodiment of the present invention, each of the LED sections includes at least two LED chips, and the LED chips are electrically connected to each other by the wire.

In accordance with an embodiment with the present invention, the structure of the conductive section may in the form of a wavy concave, a wavy convex or a spiral shape.

In accordance with an embodiment with the present invention, the LED filament may include an auxiliary strip arranging in parallel with the conductive section and extending toward to the two conductive electrodes.

In accordance with an embodiment of the present invention, the structure of a conductor of the conductive section may in the form of wavy shaped.

In accordance with an embodiment of the present invention, the light conversion layer is composed of different particles corresponding to the position above the LED section and the conductive section respectively, or the light conversion layer disposed on the LED section and the conductive section are made of different materials.

In accordance with an embodiment of the present invention, a perspective diagram of the light emission spectrum of an LED light bulb is provided. The LED light bulb may be any LED light bulb disclosed in the previous embodiments, the spectral distribution of the LED light bulb is mainly between the wavelength ranges of about 400 nm to 800 nm. Moreover, there are three peak wavelengths P1, P2, P3 in wavelength ranges corresponding to the light emitted by the LED light bulb. The wavelength of the peak value P1 is between about 430 nm and 480 nm, the wavelength of the peak value P2 is between about 580 nm and 620 nm, and the wavelength of the peak value peak P3 is between about 680 nm and 750 nm. The light intensity of the peak P1 is less than that of the peak P2, and the light intensity of the peak P2 is less than the light intensity of the peak P3.

BRIEF DESCRIPTION OF THE DRAWINGS

The present invention will become more readily apparent to those ordinarily skilled in the art after reviewing the following detailed description and accompanying drawings, in which.

DETAILED DESCRIPTION

Figure 1A:
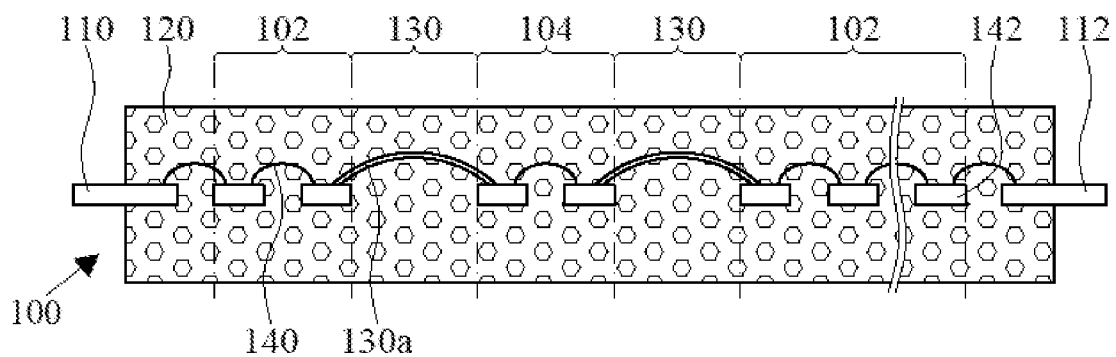
FIGS. 1A to 1F are cross sectional views of various LED filaments in accordance with the present invention.

The present disclosure provides a novel LED filament and its application the LED light bulb. The present disclosure will now be described in the following embodiments with reference to the drawings. The following descriptions of various implementations are presented herein for purpose of illustration and giving examples only. This invention is not intended to be exhaustive or to be limited to the precise form disclosed. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of components may be exaggerated for clarity. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers, or steps, these elements, components, regions, layers, and/or steps should not be limited by these terms. Unless the context indicates otherwise, these terms are only used to distinguish one element, component, region, layer, or step from another element, component, region, or step, for example as a naming convention. Thus, a first element, component, region, layer, or step discussed below in one section of the specification could be termed a second element, component, region, layer, or step in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled," or "immediately connected" or "immediately coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to a direct connection (i.e., touching) unless the context indicates otherwise.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "equal," "planar," or "coplanar," as used herein when referring to orientation, layout, location, position, shapes, sizes, amounts, or other measures do not necessarily mean an exactly identical orientation, layout, location, position, shape, size, amount, or other measure, but are intended to encompass nearly identical orientation, layout, location, position, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

Figure 1B:
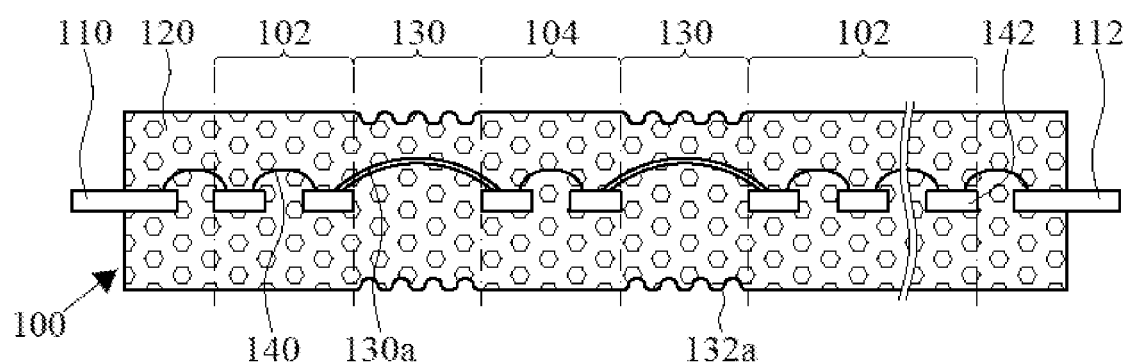
Figure 1C:
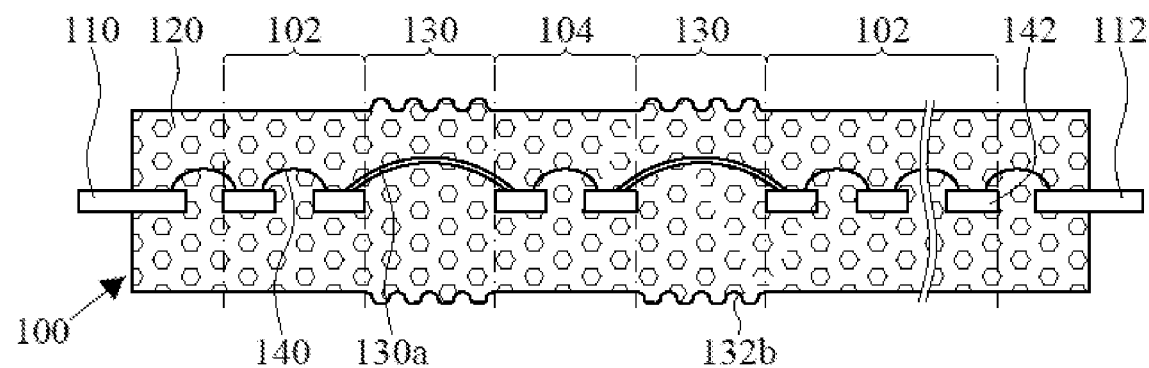
Figure 1D:
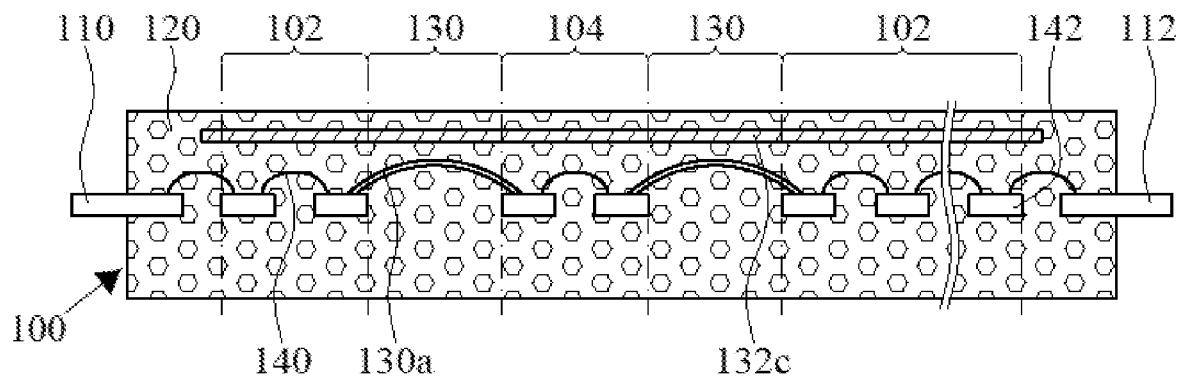
Figure 1E:
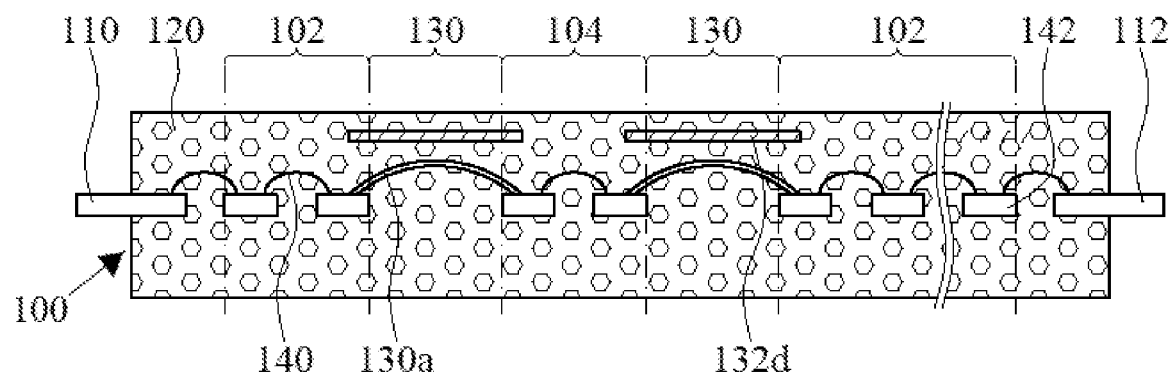
Figure 1F:
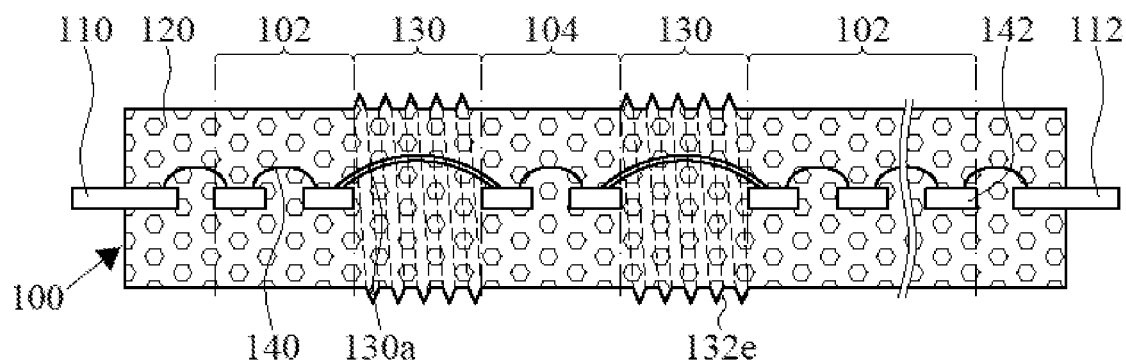
Figure 1G:
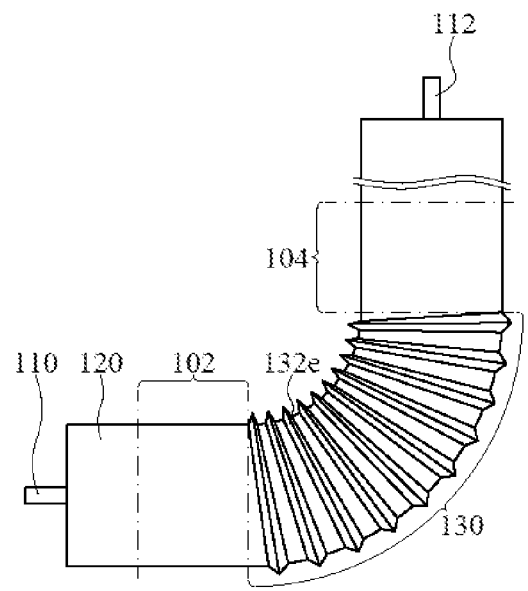
FIG. 1G is a schematic view showing the bent state of the LED filament of FIG. 1F in accordance with an embodiment of the present invention.

Referring to FIGS. 1A to 1K, FIGS. 1A to 1K are schematic views of various embodiments of an LED filament, and FIGS. 1A to 1E and FIGS. 1H to 1K are cross sectional views for different segments of the LED filament along the axial direction thereof. The FIG. 1G is a schematic view of the bent state of the LED filament of FIG. 1F. As shown in FIG. 1A to FIG. 1K, the LED filament can be divided into different segments in the axial direction of the LED filament, for example, the LED filament can be distinguished as an LED section 102, 104 (ie, the LED chip unit referred to foregoing embodiment) and the conductive section 130, but not limited thereto. The number of the LED section 102, 104 and the conductive section 130 in a single LED filament may be one or multiple. The LED section 102, 104 and conductive section 130 are disposed along the axial direction of the LED filament. Wherein, the LED section 102, 104 and the conductive section 130 may have different structure with specific function respectively to achieve different effects, as detailed below.

As shown in FIG. 1A, the LED filament 100 includes LED sections 102, 104, a conductive section 130, at least two conductive electrodes 110, 112, and a light conversion layer 120. The conductive section 130 is located between two LED sections 102, 104. The two conductive electrodes 110, 112 are disposed on the LED filament correspondingly and electrically connected to each of the LED sections 102, 104. The two LED sections 102 and 104 are electrically connected to each other through the conductive section 130. In the present embodiment, the conductive section 130 includes a conductor 130a connecting the LED sections 102 and 104, the length of the wire 140 being less than the length of the conductor 130a. The spacing between any two LED chips separately disposed in two different LED sections is greater than the spacing between any two adjacent LED chips in a single LED section. In addition, in accordance with other embodiments of the present invention, each of the LED sections 102, 104 includes at least two LED chips 142, and the LED chips 142 are electrically connected to each other through the wires 140, but the present invention is not limited thereto.

The light conversion layer 120 covers the LED sections 102, 104, the conductive section 130 and the conductive electrodes 110,112, and a part of each of the two electrodes is exposed respectively. In the present embodiment, each of the six sides of the LED chip 142 of each of the LED sections 102, 104 is covered by the light conversion layer 120. Once the six sides of the LED chip 142 are covered by the first light conversion layer 120 and may be referred to as a light conversion layer 120 to wrap the LED chips 142, this kind of covering or wrapping can be considered, but not limited to, as direct contact. Preferably, in the present embodiment, each of the six sides of the LED chip 142 directly contacts the light conversion layer 120. However, in the implementation, the light conversion layer 120 may cover merely two of the six sides of each of the LED chip 142, that is, the light conversion layer 120 directly contacts the two sides such as a top and a bottom sides showing in the FIG. 1, but not limited thereto. Similarly, the light conversion layer 120 can directly contact the surfaces of the two conductive electrodes 110, 112. In various embodiments, the light conversion layer 120 may employ an encapsulation without the function of light converting. For example, the light conversion layer 120 of the conductive section 130 may be instead of a transparent encapsulation with excellent flexibility.

In some embodiments, the LED filaments 100 are disposed in the LED light bulb, and only a single LED filament is disposed in each LED light bulb to provide sufficient illumination. Moreover, for a single LED filament, in order to present the aesthetic appearance and also to achieve uniform and broad illumination, even to achieve omni-directional light, the LED filament in the LED light bulb can be bent with various curves. Since the LED filament bent with various curves accompanies diversified illumination, the light emitting direction and coverage of the LED filament can be adjusted according to the requirement of the LED light bulb. For the purpose of the LED filament easily bent to form various curved postures, and also the bending stresses of the LED filament to be considered, the conductive section 130 of the LED filament is designed preferably without the LED chip but only the conductor 130a. The conductor 130a (for example, a metal wire, metal coating, or conductive strip) is easier to bend compare with the LED chip, in other words, the conductive section 130 without any LED chips will be more easily to bend compare with the LED section 102, 104 having the LED chip.

As shown in FIG. 1B, in the present embodiment, the LED section 102, 104 and the conductive section 130 of the LED filament 100 have different structural features. In the embodiment, the conductive section 130 further includes a wavy recess structure 132a encircling disposed on the surface of the conductive section 130 and symmetrically to the axis of the LED filament 100. In the present embodiment, the wavy recess structure 132a is recessed in the surface of the conductive section 130. The plurality of wavy recess structures 132a are arranged spaced apart along the axial direction and are parallel to each other to present a continuous wavy shape.

In the bending state of the LED filament 100, the conductive section 130 is sustained the most stresses. Therefore, the conductive section 130 is easier to bend and capable of enduring the extending and compressing stresses due to the wavy concave structure 132a of the conductive section 130. For example, the conductive section 130 may sustain both extending and compressing stresses on opposite surfaces of the conductive section 130 in the bending state, and the wavy concave structure 132a may improve the stress distribution of such extension and compression. The wavy concave structure 132a at the extension portion becomes looser and flatter, that is, the depth difference of recessions becomes smaller and the pitch of adjacent peaks or troughs becomes larger. The wavy concave structure 132a at the compression portion becomes closer and concave inwardly, that is, the depth difference of the concaves becomes larger and the pitch of adjacent peaks or troughs becomes smaller. Since the wavy concave structure 132a can provide a tolerance to endure the stresses of extension and compression and the spaces for the recessions compressed closer, the conductive section 130 is easier to be bent.

As shown in FIG. 1C, in the present embodiment, the LED sections 102, 104 and the conductive section 130 of the LED filament 100 have different structural features. In this embodiment, the conductive section 130 further includes a wavy convex structure 132b encircling disposed on the surface of the conductive section 130 and symmetrically to the axis of the LED filament 100. In the present embodiment, the wavy convex structure 132b protrudes from the surface of the conductive section 130. The plurality of wavy convex structures 132b are arranged spaced apart in the axial direction and are parallel to each other to exhibit a continuous wave shape.

In the bending state of the LED filament 100, the conductive section 130 is sustained the most stresses. Therefore, the conductive section 130 is easier to bend and capable of enduring the extending and compressing stresses due to the wavy convex structures 132b of the conductive section 130. For example, the conductive section 130 may sustain both extending and compressing stresses on opposed surfaces of the conductive section 130 in the bending state, and the wavy convex structure 132b may improve the stress distribution of such extension and compression. The wavy convex structures 132b at the extension portion becomes looser and flatter, that is, the height difference of protrusions becomes smaller and the pitch of adjacent peaks or troughs becomes larger. The wavy convex structure 132b at the compression portion becomes closer and concave inwardly, that is, the height difference of the protrusions becomes larger and the pitch of adjacent peaks or troughs becomes smaller. Since the wavy convex structure 132b can provide a tolerance to endure the stresses of extension and compression and the spaces for the protrusions compressed closer, the conductive section 130 is easier to be bent.

As shown in FIG. 1D, in the present embodiment, both the LED sections 102, 104 and the conductive section 130 of the LED filament 100 have similar contour, and the LED filament further includes an auxiliary strip 132c. The auxiliary strip 132c is disposed in the LED filament 100 and covered by the light conversion layer 120. The auxiliary strip 132c are arranged crossing the LED sections 102, 104 and the conductive section 130 of the LED filament and extending along the axial direction of the LED filament.

When the LED filament is bent, the LED sections 102, 104 have a smaller degree of curvature because of the LED chip 142 inside, in contrast, the conductive section 130 have a larger degree of curvature. In the case of the LED filament enduring serious bending, the degree of curvature between the LED sections 102, 104 and the conductive section 130 are very different. Since the stress will be concentrated in a place where the curve changes greatly, the light conversion layer 120 between the LED sections 102, 104 and the conductive section 130 of the LED filament will encounter a high possibility of cracking or even breakage. The auxiliary strip 132c has a function of absorbing the stresses and breaking up the stress concentrated in the light conversion layer 120, thereby, the auxiliary strip 132c disposed in the LED filament reduces the possibility of cracking or even breakage of the light conversion layer 120 between the LED sections 102, 104 and the conductive section 130. By the arrangement of the auxiliary strip 132c, the bending endurance of the LED filament is improved. In the present embodiment, the number of the auxiliary strip 132c is one, in other embodiments, the auxiliary strip 132c may be plural and disposed at different positions of the LED filament in the radial direction.

As shown in FIG. 1E, in the present embodiment, the LED sections 102, 104 of the LED filament 100 and the conductive section 130 are identical in appearance contour, and the LED filament further includes a plurality of auxiliary strips 132d. The plurality of auxiliary strips 132d are disposed in the LED filament 100 and covered by the light conversion layer 120. The plurality of auxiliary strips 132d are arranged along the axial direction of the LED filament and present a segmented arrangement. Each of the auxiliary strips 132d is disposed in a region corresponding to each of the conductive sections 130, and each of the auxiliary strips 132d extends through the corresponding conductive section 130 and extends toward to adjacent LED sections 102, 104 along the axial direction of the LED filament. In the present embodiment, the auxiliary strip 132d does not throughout the region corresponding to the LED sections 102, 104.

When the LED filament 100 is bent, the degree of curvature between the LED sections 102, 104 and the conductive section 130 are very different. The plurality of auxiliary strips 132d can absorb the stress caused by bending between the LED sections 102, 104 and the conductive section 130, and also reduce the stress concentration on the light conversion layer 120 between the LED sections 102, 104 and the conductive section 130. Therefore, the auxiliary strips 132d disposed in the LED filament reduces the possibility of cracking or even breakage of the light conversion layer 120 on the LED sections 102, 104 and the conductive section 130. By the arrangement of the auxiliary strip 132d, the bending endurance of the LED filament is increased, thereby improving the quality of the product. In the present embodiment, the plurality of auxiliary strips 132d extend in the axial direction of the LED filaments and are aligned with each other in a specific radial direction. In other embodiments, the plurality of auxiliary strips 132d may also extend along the axial direction of the LED filaments but not aligned with each other in a particular radial direction, and may be dispersed at different positions in the radial direction.

As shown in FIG. 1F, in the present embodiment, the LED sections 102, 104 and the conductive section 130 of the LED filament 100 have different structure features. In the present embodiment, the conductive section 130 further includes a spiral structure 132e encircling disposed on the surface of the conductive section 130 and extending along the axial direction of the LED filament 100. In the present embodiment, the spiral structure 132e is a spiral structure protruding from the surface of the conductive section 130, and the spiral structure 132e is extending along the axial direction of the LED filament from one end of the conductive section 130 (for example, adjacent to one end of the LED section 102) to the other end of the conductive section 130 (for example, adjacent to one end of another LED section 104). As shown in FIG. 1F, the portion of the spiral structure 132e located behind the conductive section 130 is represented by a dotted line in the drawing. Overall contour appearance, the spiral structure 132e showing a slanted arrangement relative to the axial direction of the LED filament. In other embodiments, the spiral structure 132e may also be a spiral-like structure that is conversely recessed into the surface of the conductive section 130. In other embodiments of the present invention, considering the mass productivity of the overall fabrication process of the LED filament 100, both the LED sections 102, 104 and the conductive section 130 of the LED filament 100 may have the same spiral structure 132e on the surfaces.

The FIG. 1G is a schematic view showing the bent state of the LED filament of FIG. 1F in accordance with an embodiment of the present invention. As shown in FIG. 1G, in the bending state of the LED filament 100, since the conductive section 130 serves as a mainly bending region and thereby it is sustained with the most stresses. The conductive section 130 is easier to bend and capable of enduring the extending and compressing stresses due to the spiral structures 132e of the conductive section 130. For example, as shown in FIG. 1G, the conductive section 130 may sustain both extending and compressing stresses on opposed surfaces of the conductive section 130 in the bending region, and the spiral structure 132e may improve the stress distribution of such extension and compression. The spiral structure 132e at the extension portion becomes looser and flatter, that is, the height difference of protrusions becomes smaller and the pitch of adjacent peaks or troughs becomes larger. In contrast, the spiral structure 132e at the compression portion becomes closer and concave inwardly, that is, the height difference of the protrusions becomes larger and the pitch of adjacent peaks or troughs becomes smaller. Since the spiral structure 132e can provide a tolerance to endure the stresses of extension and compression and the spaces for the protrusions compressed closer, the conductive section 130 is easier to be bent.

Figure 1H:
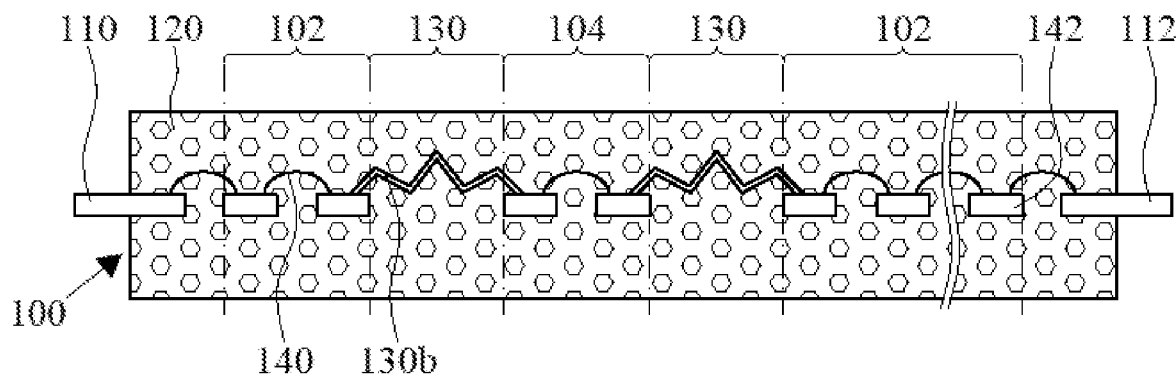
FIGS. 1H to 1K are cross sectional views of various LED filaments in accordance with the present invention.

As shown in FIG. 1H, in the present embodiment, the LED filament 100 is substantially identical to the LED filament of FIG. 1A, the difference is that the structure of the conductor 130b of the conductive section 130 in the LED filament 100 of FIG. 1H is in the form of wavy shaped. When the LED filament is bent, the conductive section 130 serves as a mainly bending region, and the conductor 130b located inside the conductive section 130 is also bent along with the bending of the conductive section 130. Due to the wavy shaped structure of the conductor 130b, the conductor 130b has better ductility to extend or compress during the conductive section 130 in a bending state, so that the conductor 130b is susceptible to stress of pulling and is not easily broken. Accordingly, the connection relationship between the conductor 130b and the connected LED chip 142 will be more stable, and the durability of the conductor 130b is also improved.

Figure 1I:
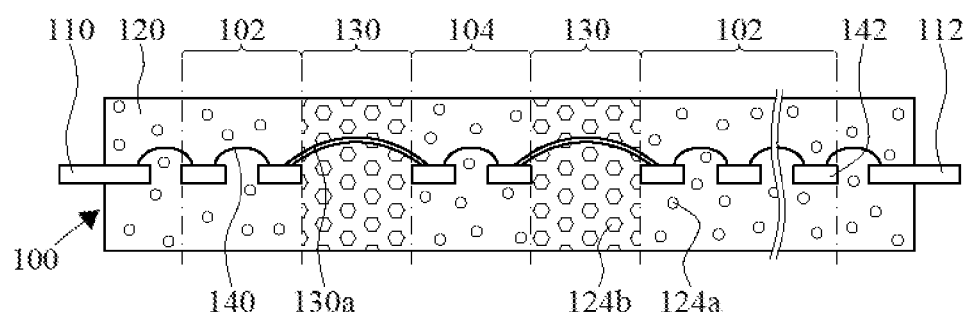

As shown in FIG. 1I, in the present embodiment, the light conversion layer 120 disposing on the LED filament are embedded with different particles distributed therein corresponding to the positions of the LED sections 102, 104 and the conductive section 130 respectively. Moreover, the light conversion layer 120 disposing on corresponding regions of the LED sections 102, 104 and the conductive section 130 may have different structures, different materials, different effects, or different distribution densities. Because of the functions of the LED sections 102, 104 and the conductive section 130 are different, and thus the light conversion layer 120 disposed thereon may be respectively provided with different types of particles to achieve different effects. For example, the light conversion layer 120 corresponding to the LED sections 102, 104 may include phosphor particles 124a, while the light conversion layer 120 corresponding to the conductive section 130 includes the light conducting particles 124b. The phosphor particles 124a can absorb the light emitted by the LED chip 142 and convert the light wavelength to reduce or increase the color temperature, and the phosphor particles 124a also affect the light diffusion. Therefore, the phosphor particles 124a embedded in the light conversion layer 120 corresponding to the LED sections 102, 104 change the color temperature of the light and also make the light dispersion more uniform. The conductive section 130 does not have an LED chip, and the conductive section 130 has a large value of curvature in a state of bending the LED filament. Besides, the light conducting particles 124b has functions of enhancing the light diffusion and light transmission. Therefore, the light conducting particles 124b are embedded in the light conversion layer 120 corresponding to the conductive section 130 and used to direct the light from the adjacent LED sections 102, 104 into the conductive section 130 and further disperse evenly throughout the conductive section 130.

The light conducting particles 124b are, for example, particles of different sizes made of polymethyl methacrylate (PMMA) or a resin, but not limited thereto. In some embodiments, the particles embedded in the conductive section 130 may also have highly elasto-plastic deformation properties, such as particles made of plastic, thereby improving the bendability of the conductive section 130 and enhancing the capability of self-sustained of the LED filament 100 in a state of bending.

Figure 1J:
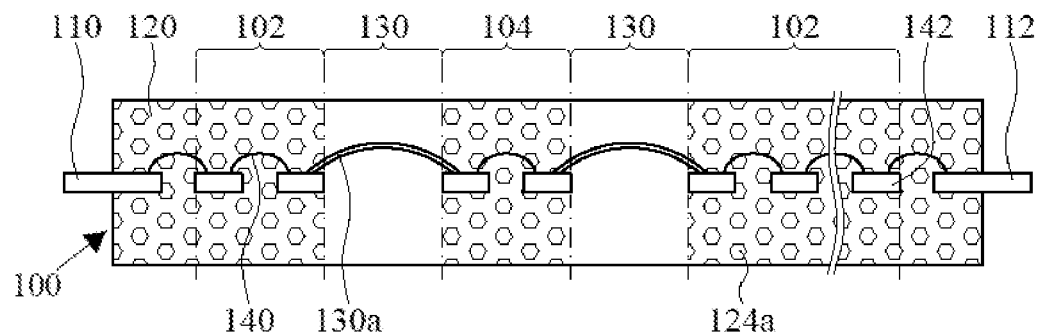

As shown in FIG. 1J, in the present embodiment, the light conversion layer 120 corresponding to the LED sections 102, 104 of the LED filament 100 includes light diffusing particles, such as phosphor particles 124a, while the light conversion layer 120 corresponding to the conductive section 130 does not include the light diffusing particles. In the present embodiment, the light conversion layer 120 disposing on the LED sections 102, 104 and the conductive section 130 is made of, for example, a silicon gel, and no functional particles in the light conversion layer 120 corresponding to the conductive section 130. In this way, it can improve the bendability of the conductive section 130.

In some embodiments, the material of the light conversion layer 120 disposed on the conductive section 130 may be different from the material of the light conversion layer 120 disposed on the LED sections 102, 104. For example, the light conversion layer 120 corresponding to the LED sections 102, 104 is made of silicone, and the light conversion layer 120 corresponding to the conductive section 130 is made of a light conducting material, for example, the light conversion layer 120 corresponding to the conductive section 130 may be made of PMMA, resin, or a combination thereof, but the present invention is not limited thereto. Since the material of the light conversion layer 120 disposing on the conductive section 130 is different from the material of the light conversion layer 120 disposing on the LED sections 102, 104, the conductive section 130 and the LED sections 102, 104 may have different properties, for example, the conductive section 130 and the LED sections 102, 104 may have different elastic coefficient. Therefore, the LED sections 102, 104 has more support to protect the LED chips 142 and the conductive sections 130 has better bendability, and subsequently the LED filaments 100 can be bent to present a diverse curve.

Figure 1K:
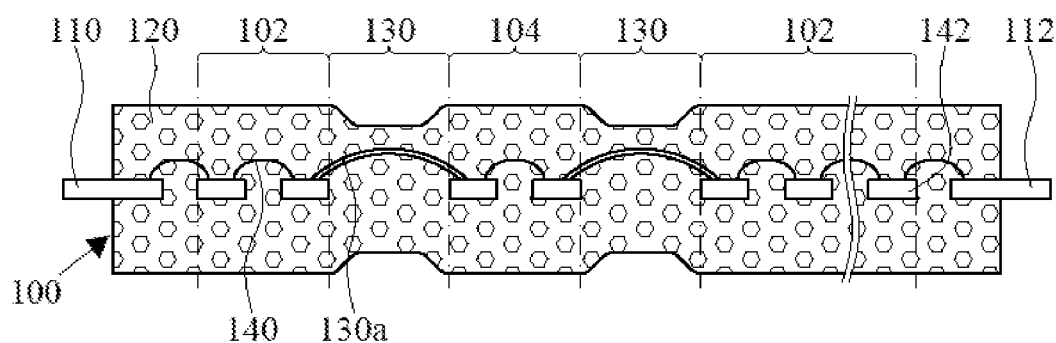

As shown in FIG. 1K, in the present embodiment, the LED sections 102, 104 and the conductive section 130 of the LED filament 100 have different contour features. In the present embodiment, the LED sections 102, 104 and the conductive section 130 have different widths, thicknesses or diameters in the radial direction of the LED filament 100. In other words, the minimum distance between the opposite surfaces of the LED sections 102, 104 (that is, an outer diameter of the LED sections 102, 104) is greater than the maximum distance between the opposite surfaces of the conductive section 130 (that is, an outer diameter of the conductive section 130). As shown in FIG. 1K, the outer diameter of the conductive section 130 is shorter than the outer diameter of the LED sections 102, 104. When the LED filament 100 is bent, the conductive section 130 serves as a mainly bending region, and the thinner conductive section 130 is easier to bend with a variety of curves.

In this embodiment, the outer surface of the conductive section 130 is formed with a smooth transition curve between adjacent LED sections 102, 104, and the outer diameter of the conductive section 130 is gradually thinner from an end adjacent to the LED sections 102, 104 toward to the middle of the conductive section 130. That is, the junction of the conductive section 130 and the LED sections 102, 104 is provided with a smooth curve, therefore the LED filament in a state of bending, the stress can be dispersed and the stress does not concentrate at the junction between the conductive section 130 and the LED section 102, 104. Therefore the possibility of cracking or even rupture at the light conversion layer 120 can be reduced. In other embodiments, the outer diameter of the conductive section 130 may also be greater than the outer diameter of the LED sections 102, 104, and the light conversion layer 120 disposing on the LED sections 102, 104 and the light conversion layer 120 disposing on the conductive section 130 may be made of different materials. For example, for the LED sections 102, 104, the light conversion layer 120 is made of harder and supportive materials, and for the conductive section 130 the light conversion layer 120 is made of a flexible transparent encapsulation, such as PMMA, resin or other single material or composite material.

The various embodiments shown in FIGS. 1A to 1K may be implemented separately or in combination. For example, the LED filament 100 shown in FIG. 1B can be used in combination with the LED filament 100 shown in FIG. 1D, that is, the conductive section 130 of the LED filament 100 has a wavy concave structure 132a, and also embedded with auxiliary strip 132c inside the LED filament 100 to enhance the bendability and the capability of self-sustained of the LED filament. Alternatively, the LED filament shown in FIG. 1I can be used in combination with the LED filament shown in FIG. 1G, that is, the particles distributed in the light conversion layer 120 corresponding to the LED sections 102, 104 have different sizes, different materials and/or different densities from the particles distributed in the light conversion layer 120 corresponding to the conductive section 130. Moreover, the conductive section 130 further includes a spiral structure 132e, so that not only the bendability but also the lighting uniformity of the LED filament is enhanced. Thereby the illumination of the omni-directional light is enhanced.

The LED filament structure in the aforementioned embodiments is mainly applicable to the LED light bulb product, so that the LED light bulb can achieve the omni-directional light illuminating effect through the flexible bending characteristics of the single LED filament. The specific embodiment in which the aforementioned LED filament applied to the LED light bulb is further explained below.

Figure 2A:
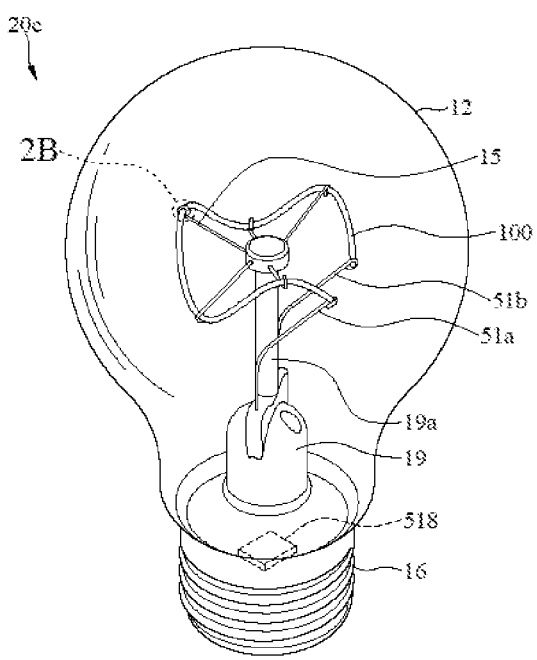
FIG. 2A illustrates a perspective view of an LED light bulb according to the third embodiment of the instant disclosure.

Please refer to FIG. 2A. FIG. 2A illustrates a perspective view of an LED light bulb according to the present disclosure. The LED light bulb 20c comprises a bulb shell 12, a bulb base 16 connected with the bulb shell 12, two conductive supports 51a, 51b disposed in the bulb shell 12, a driving circuit 518 electrically connected with both the conductive supports 51a, 51b and the bulb base 16, a stem 19, supporting arms 15 and a single LED filament 100.

The bulb shell 12 is a material which is preferably light transmissive or thermally conductive, such as, glass or plastic, but not limited thereto. In implementation, the bulb shell 12 may be doped with a golden yellow material or its surface coated with a yellow film to absorb a portion of the blue light emitted by the LED chip to reduce the color temperature of the light emitted by the LED light bulb 20c. In other embodiments of the present invention, the bulb shell 12 includes a layer of luminescent material (not shown), which may be formed on the inner surface or the outer surface of the bulb shell 12 according to design requirements or process feasibility, or even integrated in the material of the bulb shell 12. The luminescent material layer comprises low reabsorption semiconductor nanocrystals (hereinafter referred to as quantum dots), the quantum dots comprises a core, a protective shell and a light absorbing shell, and the light absorbing shell is disposed between the core and the protective shell. The core emits the emissive light with emission wavelength, and the light absorbing shell emits the excited light with excitation wavelength. The emission wavelength is longer than the excitation wavelength, and the protective shell provides the stability of the light.

The LED filament 100 shown in FIG. 2A is bent to form a contour resembling to a circle while being observed from the top view of FIG. 2A. According to the embodiment of FIG. 2A, the LED filament 100 is bent to form a wave shape from side view. The shape of the LED filament 100 is novel and makes the illumination more uniform. In comparison with a LED bulb having multiple LED filaments, single LED filament 100 has less connecting spots. In implementation, single LED filament 100 has only two connecting spots such that the probability of defect soldering or defect mechanical pressing is decreased.

The stem 19 has a stand 19a extending to the center of the bulb shell 12. The stand 19a supports the supporting arms 15. The first end of each of the supporting arms 15 is connected with the stand 19a while the second end of each of the supporting arms 15 is connected with the LED filament 100.

Figure 2B:
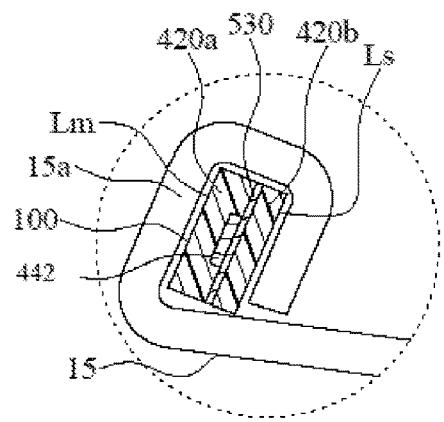
FIG. 2B illustrates an enlarged cross-sectional view of the dashed-line circle of FIG. 2A.

Please refer to FIG. 2B which illustrates an enlarged cross-sectional view of the dashed-line circle of FIG. 2A. The second end of each of the supporting arms 15 has a clamping portion 15a which clamps the body of the LED filament 100. The clamping portion 15a may, but not limited to, clamp at either the wave crest or the wave trough. Alternatively, the clamping portion 15a may clamp at the portion between the wave crest and the wave trough. The shape of the clamping portion 15a may be tightly fitted with the outer shape of the cross-section of the LED filament 100. The dimension of the inner shape (through hole) of the clamping portion 15a may be a little bit smaller than the outer shape of the cross-section of the LED filament 100. During manufacturing process, the LED filament 100 may be passed through the inner shape of the clamping portion 15a to form a tight fit. Alternatively, the clamping portion 15a may be formed by a bending process. Specifically, the LED filament 100 may be placed on the second end of the supporting arm 15 and a clamping tooling is used to bend the second end into the clamping portion to clamp the LED filament 100.

The supporting arms 15 may be, but not limited to, made of carbon steel spring to provide with adequate rigidity and flexibility so that the shock to the LED light bulb caused by external vibrations is absorbed and the LED filament 100 is not easily to be deformed. Since the stand 19a extending to the center of the bulb shell 12 and the supporting arms 15 are connected to a portion of the stand 19a near the top thereof, the position of the LED filaments 100 is at the level close to the center of the bulb shell 12. Accordingly, the illumination characteristics of the LED light bulb 20c are close to that of the traditional light bulb including illumination brightness. The illumination uniformity of LED light bulb 20c is better. In the embodiment, at least a half of the LED filaments 100 is around a center axle of the LED light bulb 20c. The center axle is coaxial with the axle of the stand 19a.

In the embodiment, the first end of the supporting arm 15 is connected with the stand 19a of the stem 19. The clamping portion of the second end of the supporting arm 15 is connected with the outer insulation surface of the LED filaments 100 such that the supporting arms 15 are not used as connections for electrical power transmission. In an embodiment where the stem 19 is made of glass, the stem 19 would not be cracked or exploded because of the thermal expansion of the supporting arms 15 of the LED light bulb 20c. Additionally, there may be no stand in an LED light bulb. The supporting arm 15 may be fixed to the stem or the bulb shell directly to eliminate the negative effect to illumination caused by the stand.

The supporting arm 15 is thus non-conductive to avoid a risk that the glass stem 19 may crack due to the thermal expansion and contraction of the metal filament in the supporting arm 15 under the circumstances that the supporting arm 15 is conductive and generates heat when current passes through the supporting arm 15.

In different embodiments, the second end of the supporting arm 15 may be directly inserted inside the LED filament 100 and become an auxiliary piece in the LED filament 100, which can enhance the mechanical strength of the LED filament 100. Relative embodiments are described later.

The LED filament 100 shown in FIG. 2A is curved to form a circular shape in a top view while the LED filament is curved to form a wave shape in a side view. The wave shaped structure is not only novel in appearance but also guarantees that the LED filament 100 illuminates evenly. In the meantime, the single LED filament 100, comparing to multiple LED filaments, requires less joint points (e.g., pressing points, fusing points, or welding points) for being connected to the conductive supports 51a, 51b. In practice, the single LED filament 100 (as shown in FIG. 2A) requires only two joint points respectively formed on the two conductive electrodes, which effectively lowers the risk of fault welding and simplifies the process of connection compared to the mechanically connection in the tightly pressing manner.

Figure 2C:
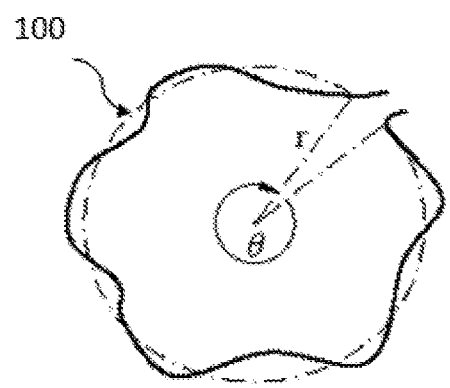
FIG. 2C is a projection of a top view of an LED filament of the LED light bulb of FIG. 2A.

Please refer to FIG. 2C. FIG. 2C is a projection of a top view of an LED filament of the LED light bulb 20c of FIG. 2A. As shown in FIG. 2C, in an embodiment, the LED filament may be curved to form a wave shape resembling a circle observed in a top view to surround the center of the light bulb or the stem. In different embodiments, the LED filament observed in the top view can form a quasi-circle or a quasi U shape.

As shown in FIG. 2B and FIG. 2C, the LED filament 100 surrounds with the wave shape resembling a circle and has a quasi-symmetric structure in the top view, and the lighting face of the LED filament 100 is also symmetric.

In an embodiment, the LED light bulb 20c shown in FIG. 2A may be a light bulb with an A size. The two joint points for electrical connection between the two conductive supports 51a, 51b and the LED filament 100 is spaced by a distance, which is within 3 cm and is preferably within 2 cm. The LED filament 100 surrounds with the wave shape; therefore, the LED filament 100 may generate an effect of an omnidirectional light, and the two joint points may be close to each other such that the conductive supports 51a, 51b are substantially below the LED filament 100. Visually, the conductive supports 51a, 51b keeps a low profile and is integrated with the LED filament 100 to show an elegance curvature. While being observed from a side of the LED filament 100 in the LED light bulb 20c, a distance between the highest point and the lowest point of the wave of the LED filament 100 is from 2.2 cm to 3.8 cm and is preferably from 2.2 cm to 2.8 cm. Thus it could be ensured that there would be a space for heat dissipation above the LED filament 100.

As shown in FIG. 2A, the shape of the LED filament 100 may satisfy a curve equation. The position of the LED filament 100 in space relates to the Cartesian coordinates (i.e., a xyz coordinates) shown in FIG. 2A. An x-y plane of the xyz coordinates is a plane passing through a top of the stem 19 (i.e., a top of the stand 19a in the embodiment in which the stand 19a is deemed as a part of the stem 19). An origin of the xyz coordinates is at the top of the stem 19 (the origin may be at a center of a sphere body of a bulb shell of a light bulb without any stems). The x-y plane is perpendicular to a height direction of the LED light bulb 20c.

The two conductive electrodes (i.e., the welding points, the joint points, the contacting points, or the fusing points) are symmetrically disposed at two sides of a y-axis of the xyz coordinates. A z-axis of the xyz coordinates is coaxial with stem 19 (or is coaxial with a central axis passing through a horizontal plane of the LED light bulb 20c). The shape of the LED filament 100 varies along an x-direction, a y-direction, and a z-direction according to t, and t is a variable between 0 and 1. A position of points of the LED filament 100 in the xyz coordinates is defined as X, Y and Z and satisfies the curve equation. Herein, the term "points of the LED filament" means "most of points of the LED filament", or "more than 60% of points of the LED filament." The curve equation is:

$X = m1 * \cos(t * 360)$, $Y = m2 * \sin(t * 360)$, $Z = n * \cos(t * 360 * k)$, The LED filament 100 varies along the x-direction, the y-direction, and the z-direction according to t. When X=0, |Y|max=m2 (a max value of |Y| is m2), and |Z|max=n (a max value of |Z| is n). When Y=0, |X|max=m1 (a max value of |X| is m1), and |Z|max=n (the max value of |Z| is n). When Z=0, |X|max=m1 (the max value of |X| is m1), and |Y|max=m2 (the max value of |Y| is m2). m1 is a length (projection length) in the x-direction, and 24≤m2≤27 (mm). m2 is a length (projection length) in the y-direction, and 24≤m2≤27 (mm). Based upon the above configuration, the LED filament 100 in the bulb shell 12 may provide good luminous flux. n is a height of the highest point of the LED filament 100 from the x-y plane in the z-direction, and 0<n≤14 (mm). Based upon the above condition, wires in turning points of the LED filament 100 may hard to break. k is a number of the highest point(s). The more the supporting arms (or supporting bars), the hard the manufacture is; therefore, k is configured as: 2≤k≤8. A curve line drawn by the above curve equation may be deemed as a reference for the LED filament 100 being distributed in space. According to conditions of different arts and equipment, the configuration of the LED filament 100 in practice may have about 0 to 25% in spatial difference different from the reference based upon the curve equation. Certain region(s) on the filament with supporting point(s) may be relatively highest point(s) and lowest point(s). The spatial difference of the certain region(s) may be less, e.g., 0 to 20%. In an embodiment, r is the radius of a cross section of the bulb shell on the horizontal plane. Cross sections of the bulb shell on the horizontal plane from the bottom to the top of the bulb shell along the height direction may have varied radii, and the radius r is the one with the largest value. In such case, the values of m1, m2, and n may be set as: $0.8*r \leq m1 \leq 0.9*r$; $0.8*r \leq m2 \leq 0.9*r$; $0 < n \leq 0.47*r$. Additionally, p is the radius of an interface of the bulb base utilized for being connected to the bulb shell, G is the length of the LED filament, and, in such case, the values of G may be set as: $1.2*p \leq G \leq 5.6*r$. Based upon the above setting, the LED filament may not only achieve the aforementioned effect, but may also need the least length and the least number of the LED chips. As a result, the cost of materials for the manufacture of the LED light bulb may reduce, and the temperature of the LED light bulb during operation can be suppressed.

Figure 3:
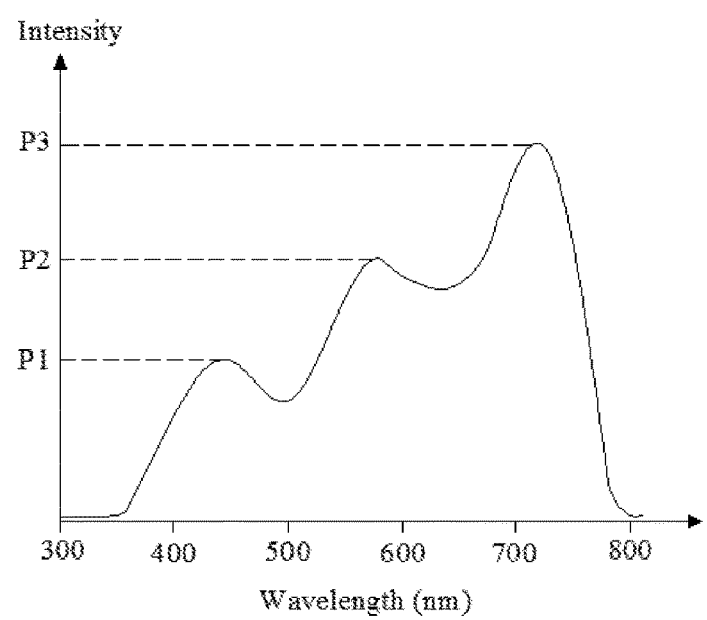
FIG. 3 is a schematic view showing the light emission spectrum of an LED light bulb in accordance with an embodiment of the present invention.
Figure 4:
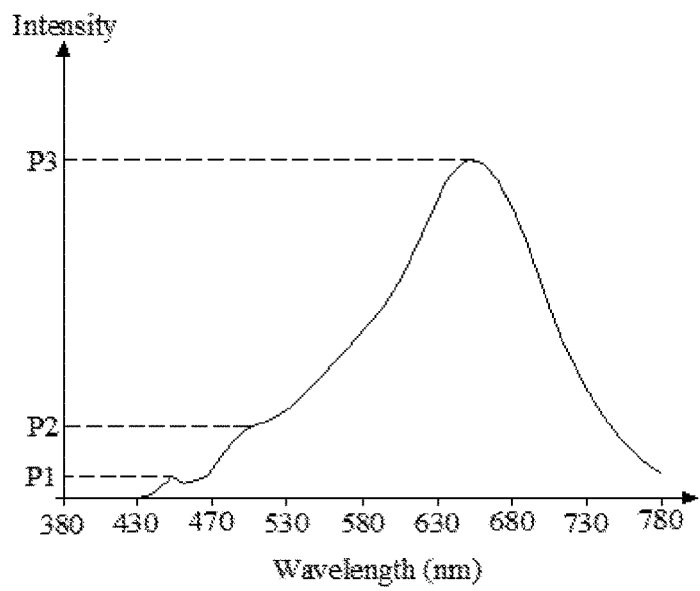
FIG. 4 is a schematic view showing the light emission spectrum of an LED light bulb in accordance with another embodiment of the present invention.

Referring to FIG. 3, which is a schematic diagram of the light emission spectrum of an LED light bulb according to an embodiment of the present invention. In the present embodiment, the LED light bulb may be any of the LED light bulbs disclosed in the previous embodiments, and any one of the LED light bulbs disclosed in the previous embodiments is provided. The light emitted by the LED light bulb is measured by a spectrometer to obtain a spectrum diagram as shown in FIG. 3. From the spectrum diagram, the spectral distribution of the LED light bulb is mainly between the wavelength ranges of about 400 nm to 800 nm. Moreover, there are three peaks of intensity values P1, P2, P3 in wavelength ranges corresponding to the light emitted by the LED light bulb. The wavelength of the intensity value P1 is between about 430 nm and 480 nm, the wavelength of the intensity value P2 is between about 580 nm and 620 nm, and the wavelength of the intensity value P3 is between about 680 nm and 750 nm. The light intensity of the peak P1 is less than that of the peak P2, and the light intensity of the peak P2 is less than the light intensity of the peak P3. As shown in FIG. 3, such a spectral distribution is close to the spectral distribution of a conventional incandescent filament lamp and also close to the spectral distribution of natural light. In accordance with an embodiment of the present invention, a schematic diagram of the light emission spectrum of a single LED filament is shown in FIG. 4. From the spectrum diagram, it can be seen that the spectral distribution of the LED light bulb is mainly between the wavelength range of about 400 nm to 800 nm, and there are three peaks of intensity values P1, P2, P3 in that wavelength range. The wavelength of the intensity value P1 is between about 430 nm and 480 nm, the wavelength of the intensity value P2 is between about 480 nm and 530 nm, and the wavelength of the intensity value peak P3 is between about 630 nm and 680 nm. Such a spectral distribution is close to the spectral distribution of a conventional incandescent filament lamp and also close to the spectral distribution of natural light.

The meaning of the term "a single LED filament" and "a single strip LED filament" as used in the present invention is mainly composed of the aforementioned conductive section, the LED section, the connection between thereof, the light conversion layer (including the consecutive top layer or the bottom layer, with continuous formation to cover or support all the components), and two conductive electrodes electrically connected to the conductive brackets of the LED light bulb disposing at both ends of the LED filament, which is the single LED filament structure referred to in the present invention.

Figure 5A:
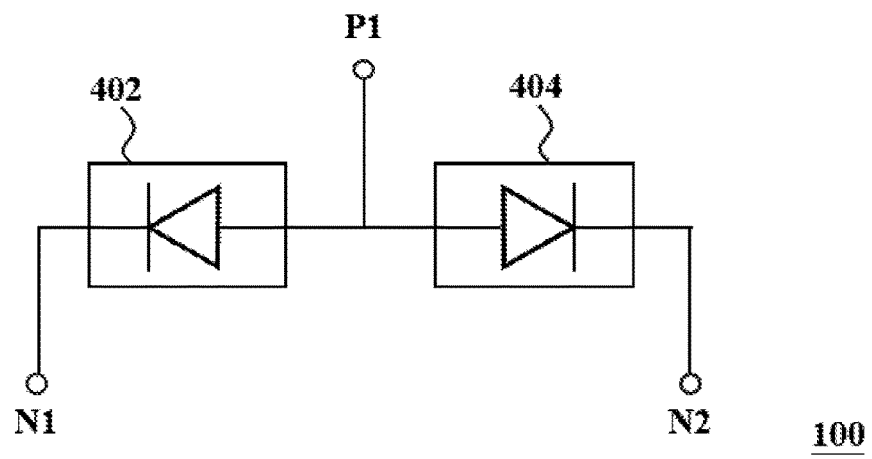
FIGS. 5A to 5C are schematic circuit diagrams of an LED filament in accordance with an embodiment of the present invention.

In some embodiments, LED filament 100 may have multiple LED sections. At least part or all of LED chips on a single LED section are electrically connected in series. Different LED sections are electrically connected in parallel. Anode and cathode of each LED section may serve as a positive electrode and negative electrodes of the LED filament, respectively. The negative electrodes separately connect with two or more of the conductive supports (e.g., conductive supports 51a, 51b in FIG. 2A) and finally connect to a power module (or driving circuit 518 in FIG. 2A). As shown in FIG. 5A, which is a schematic circuit diagram of the LED filament according to some embodiments of the present invention, LED filament 100 in this embodiment has two LED sections 402, 404. Each LED section 402, 404 includes one or more LED chips. LED chips in a single LED section are electrically connected in series. Two LED sections 402, 404 have respective current paths after they have been electrically connected (i.e. in parallel). In detail, in this embodiment, anodes of LED sections 402, 404 are electrically connected together to serve as a positive electrode P1 of LED filament 100. Cathodes of LED section 402 and 404 serve as a first negative electrode N1 and a second negative electrode N2, respectively. Positive electrode P1, first negative electrode N1 and second negative electrode N2 are separately electrically connected to the power module through conductive supports such as conductive supports 51a, 51b and power module 518 shown in FIG. 2A.

Figure 5B:
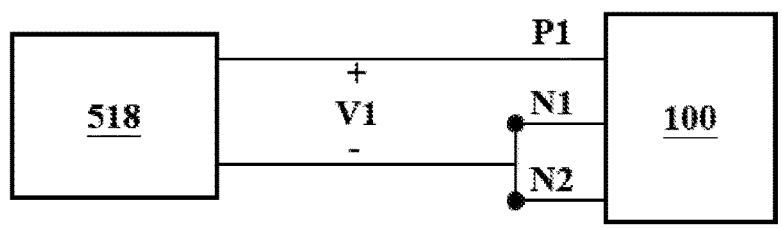
Figure 5C:
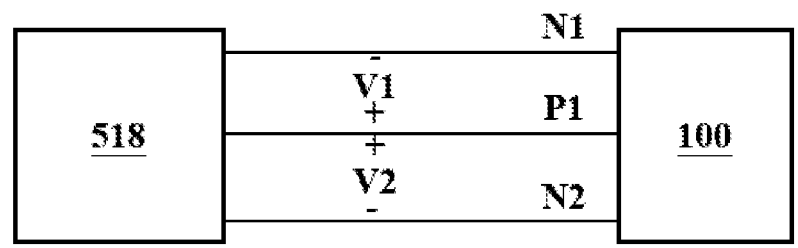

In more detail, the connection relationship between positive electrode P1, first negative electrode N1 and second negative electrode N2 may be shown as FIG. 5B or FIG. 5C, in which FIGS. 5B and 5C are two schematic views of electrical connections of the LED filament according to some embodiments of the present invention. Please refer to FIG. 5B first. In this embodiment, positive electrode P1 of LED filament 100 is electrically connected to a first output terminal (also called "positive output terminal) of power module 518. First and second negative electrodes N1, N2 of LED filament 100 are electrically connected together and then jointly electrically connected to a second output terminal (also called "negative output terminal") of power module 518. Further refer to FIG. 5A, under the electrical relationship shown in FIG. 5B, LED sections 402, 404 can be deemed as being electrically connected to the output terminals of power module 518 in parallel. Thus, all LED sections 402, 404 are driven by driving voltage V1 between the first and second output terminals. Under a precondition of LED sections 402, 404 having identical or similar chips number and arrangement, the driving current from power module 518 will evenly dividedly flow to each of LED sections 402, 404. As a result, LED sections 402, 404 can present approximately even intensity and/or color temperature.

Please further refer to FIG. 5C. In this embodiment, positive electrode P1 of LED filament 100 is electrically connected to the first output terminal of power module 518, first negative electrode N1 of LED filament 100 is electrically connected to the second output terminal (also called "first negative output terminal") of power module 518, and the second negative electrode N2 of LED filament 100 is electrically connected to the third output terminal (also called "second negative output terminal") of power module 518. Driving voltage V1 is formed between the first output terminal and the second output terminal of power module 518, and another driving voltage V2 is formed between the first output terminal and the third output terminal of power module 518. Referring to FIG. 5A together, under the electrical relationship shown in FIG. 5C, LED section 402 is electrically connected between the first output terminal and the second output terminal, and LED section 404 is electrically connected between the first output terminal and the third output terminal. As a result, LED sections 402 and 404 can be deemed as being driven by driving voltages V1, and V2, respectively. In such an arrangement, the driving currents provided by power module 518 to LED sections 402, 404 can be independently controlled by adjusting output voltages V1 and V2, so as to make LED sections 402, 404 separately generate corresponding intensity and/or color temperature. In other words, dimming the different LED sections individually on a single LED filament can be implemented by design and control of the power module based on the arrangement of FIG. 5C.

In some embodiments, the second and third output terminals of power module 518 can be electrically connected together through a resistor, and either of the second and third output terminals of the power module 518 is electrically connected to a ground terminal. By this arrangement, negative output terminals with different levels can be obtained to generate two different driving voltages V1 and V2. In some embodiments, levels of the second and third output terminals can be controlled by a circuit. The present invention is not limited thereto.

Figure 6A:
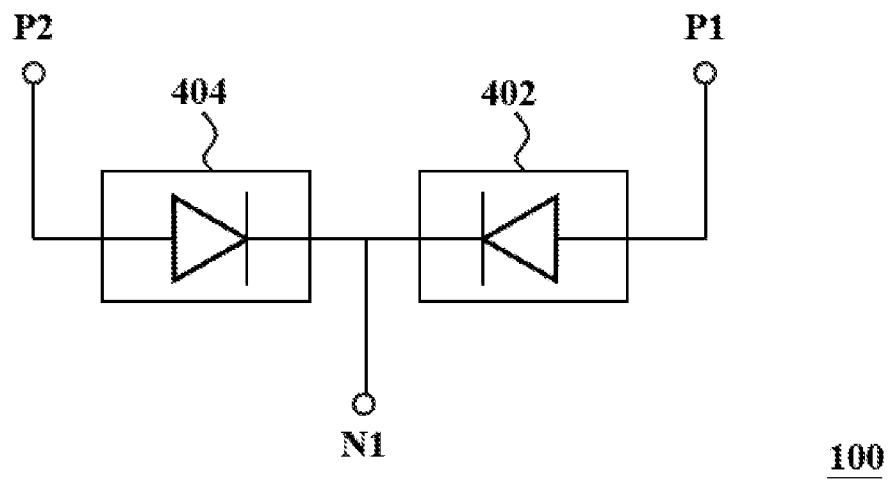
FIGS. 6A to 6C are schematic circuit diagrams of an LED filament in accordance with another embodiment of the present invention.

FIG. 6A is a schematic circuit diagram of the LED filament according to some embodiments of the present invention. In this embodiment, LED filament 100, which is similar to the one shown in FIG. 6A, has two LED sections 402, 404, and thus the details of the LED sections 402, 404 will not be repeated herein. A main difference between this embodiment and the embodiment shown in FIG. 6A is that cathodes of LED sections 402, 404 of this embodiment are electrically connected together to serve as negative electrode N1 of the LED filament, and anodes of LED sections 402, 404 serve as first positive electrode P1 and second positive electrode P2 of LED filament 100, respectively. Negative electrode N1, first positive electrode P1 and second positive electrode P2 of LED filament 100 are electrically connected to the power module through conductive supports, such as conductive supports 51a, 51b and power module 518 shown in FIG. 2A.

Figure 6B:
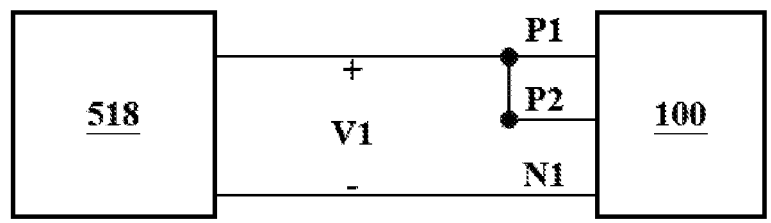
Figure 6C:
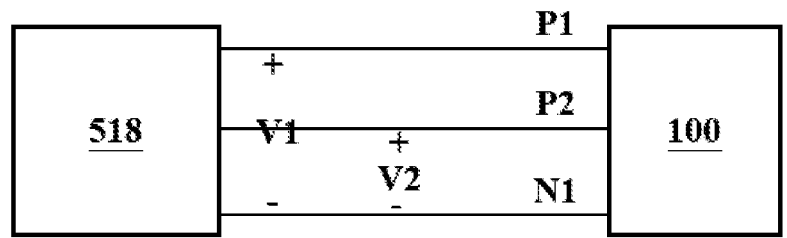

The electrical relationship between negative electrode N1, first positive electrode P1 and second positive electrode P2 of LED filament 100 and the power module may be shown in FIG. 6B or 6C. FIGS. 6B and 6C are two schematic views of electrical connections of the LED filament according to two different embodiments. Please refer to FIG. 6B first. In this embodiment, a first positive electrode P1 and a second positive electrode P2 of LED filament 100 are electrically connected together and jointly electrically connected to a first output terminal (also called "positive output terminal) of power module 518. Negative electrode N1 of LED filament 100 is electrically connected to a second output terminal (also called "negative output terminal") of power module 518. Further refer to FIG. 6A, under the electrical relationship shown in FIG. 6B, LED sections 402, 404 can be deemed as being electrically connected to the output terminals of power module 518 in parallel. Thus, all LED sections 402, 404 are driven by driving voltage V1 between the first and second output terminals. Under a precondition of LED sections 402, 404 having identical or similar chips number and arrangement, the driving current from power module 518 will evenly dividedly flow to each of LED sections 402, 404. As a result, LED sections 402, 404 can present approximately even intensity and/or color temperature. This arrangement is equivalent to that of the embodiment shown in FIG. 6B.

Please further refer to FIG. 6C. In this embodiment, positive electrode P1 of LED filament 100 is electrically connected to the first output terminal of power module 518, second positive electrode P2 of LED filament 100 is electrically connected to the second output terminal (also called "second positive output terminal") of power module 518, and negative electrode N1 of LED filament 100 is electrically connected to the third output terminal (also called "negative output terminal") of power module 518. Driving voltage V1 is formed between the first output terminal and the third output terminal of power module 518, and another driving voltage V2 is formed between the second output terminal and the third output terminal of power module 518. Please further refer to FIG. 6A. Under the electrical relationship shown in FIG. 6C, LED section 402 is electrically connected between the first output terminal and the third output terminal, and LED section 404 is electrically connected between the second output terminal and the third output terminal. As a result, LED sections 402 and 404 can be deemed as being driven by driving voltages V1, and V2, respectively. In such an arrangement, the driving currents provided by power module 518 to LED sections 402, 404 can be independently controlled by adjusting output voltages V2, V2 so as to make LED sections 402, 404 separately generate corresponding intensity and/or color temperature. In other words, in the arrangement of FIG. 6C, a dimming function can be implemented to a single LED filament by design and control of the power module.

Figure 7A:
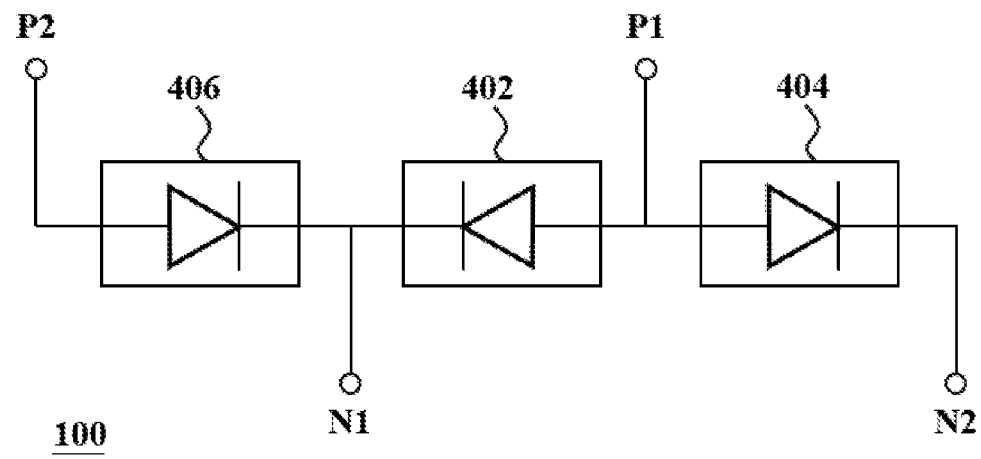
FIGS. 7A to 7D are schematic circuit diagrams of an LED filament in accordance with another embodiment of the present invention.
Figure 7B:
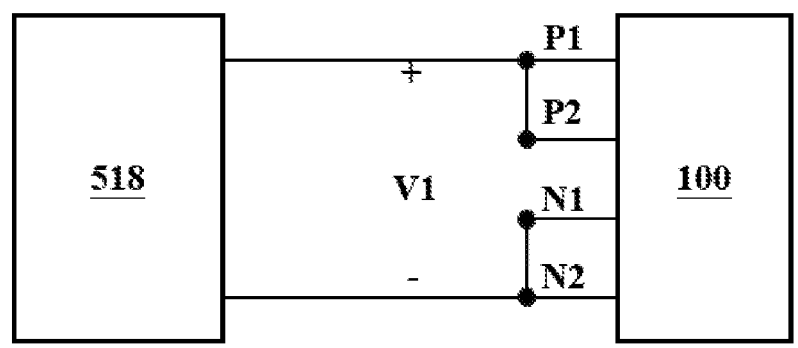

FIG. 7A is a schematic circuit diagram of the LED filament according to some embodiments of the present invention. In this embodiment, LED filament 100 has three LED sections 402, 404, 406 as shown in FIG. 7A. In detail, LED filament 100 of this embodiment is based on FIG. 5A and adds LED section 406 (also deemed as being based on FIG. 6A and adding LED section 404 in FIG. 7A, wherein LED section 406 in FIG. 7A corresponds to LED section 404 in FIG. 6A). The arrangement of LED sections 402, 404 can refer to the above embodiments, it will not be repeated here. In this embodiment, the arrangement of LED section 406, which is identical or similar to that of LED section 402 or 404, includes one or more LED chips. The LED chips are electrically connected in series. Three LED sections 402, 404, 406 have respective current paths after they have been electrically connected (i.e. in parallel). In detail, in this embodiment, cathodes of LED sections 406 and 402 are electrically connected together (i.e. cathodes of LED sections 402, 406 jointly serve as a first negative electrode N1). And anode of LED section 406 serves as a second positive electrode P2 of LED filament 100. In other words, In this embodiment, LED filament 100 further includes second positive electrode P2 formed by connecting to the anode of LED section 406 other than first positive electrode P1, first negative electrode N1 and second negative electrode N2.

In this embodiment, under the arrangement of LED filament 100, the electrical relationship between LED filament 100 and the power module may be shown in FIGS. 7B to 40D to implement the current sharing drive control or sectional independent control. FIGS. 6B and 39C are two schematic views of electrical connections of two embodiments of the LED filament. Please refer to FIG. 6B first. In this embodiment, a first positive electrode P1 and a second positive electrode P2 of LED filament 100 are electrically connected together and jointly electrically connected to a first output terminal (also called "positive output terminal)

of power module 518. First negative electrode N1 and second negative electrode N2 of LED filament 100 are electrically connected together and electrically connected to a second output terminal (also called "negative output terminal") of power module 518. Further refer to FIG. 7A, under the electrical relationship shown in FIG. 7B, LED sections 402, 404, 406 can be deemed as being electrically connected to the output terminals of power module 518 in parallel. Thus, all LED sections 402, 404, 406 are driven by driving voltage V1 between the first and second output terminals. Under a precondition of LED sections 402, 404, 406 having identical or similar chips number and arrangement, the driving current from power module 518 will evenly dividedly flow to each of LED sections 402, 404, 406. As a result, LED sections 402, 404, 406 can present approximately even intensity and/or color temperature. This arrangement is equivalent to that of the embodiment shown in FIGS. 5B and 6B.

Figure 7C:
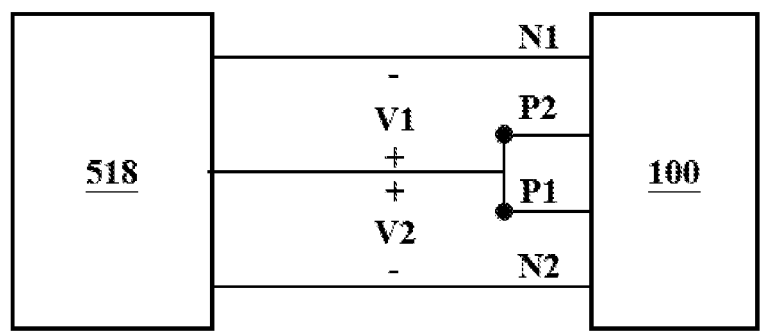

Please further refer to FIG. 7C. In this embodiment, first positive electrode P1 and second positive electrode P2 of LED filament 100 are electrically connected together and jointly electrically connected to the first output terminal (also called "first positive output terminal") of power module 518, first negative electrode N1 of LED filament 100 is electrically connected to the second output terminal (also called "first negative output terminal") of power module 518, and second negative electrode N2 of LED filament 100 is electrically connected to the third output terminal (also called "second negative output terminal") of power module 518. Under such an arrangement, both first positive electrode P1 and second positive electrode P2 can be deemed as the same terminal. Thus, the whole circuit is equivalent to FIG. 5C. Related control manner, functions and effects can refer to the description of FIG. 5C. The arrangement of this embodiment can make a single filament have a two-stage dimming effect.

Figure 7D:
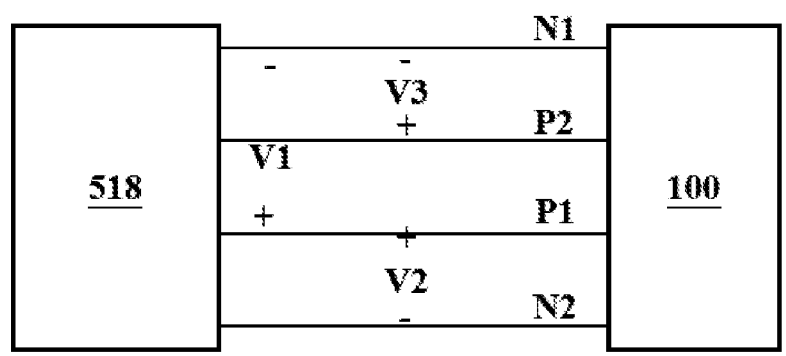

Please further refer to FIG. 7D. In this embodiment, first positive electrode P1 of LED filament 100 is electrically connected to the first output terminal (also called "first positive output terminal") of power module 518, second positive electrode P2 of LED filament 100 is electrically connected to the second output terminal (also called "second positive output terminal") of power module 518, first negative electrode N1 of LED filament 100 is electrically connected to the third output terminal (also called "first negative output terminal"), and second negative electrode N2 is electrically connected to fourth output terminal (also called "second negative output terminal") of power module 518. Further refer to FIG. 7A, under such an arrangement shown in FIG. 7D, LED section 402 is electrically connected between the first and third terminals, LED section 404 is electrically connected between the first and fourth output terminals, and LED section 406 is electrically connected between the second and third terminals. Thus, LED sections 402, 404, 406 can be deemed as being driven by driving voltages V1, V2, V3, respectively. In such an arrangement, the driving currents provided by power module 518 to LED sections 402, 404, 406 can be independently controlled by adjusting output voltages V2, V2, V3 so as to make LED sections 402, 404, 406 separately generate corresponding intensity and/or color temperature. The arrangement of this embodiment can make a single filament have a three-stage dimming effect.

Figure 8A:
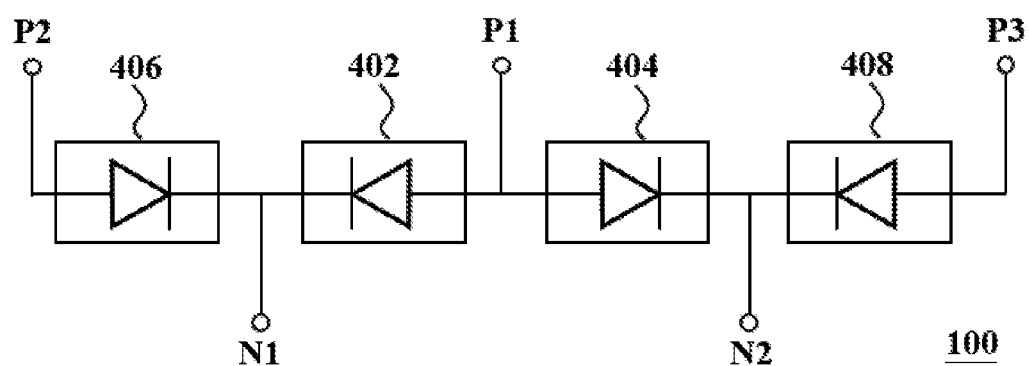
FIGS. 8A to 8E are schematic circuit diagrams of an LED filament in accordance with another embodiment of the present invention.
Figure 8B:
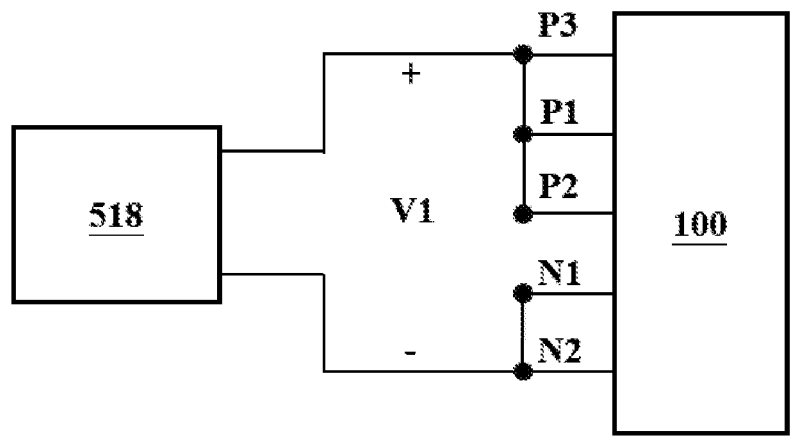
Figure 8C:
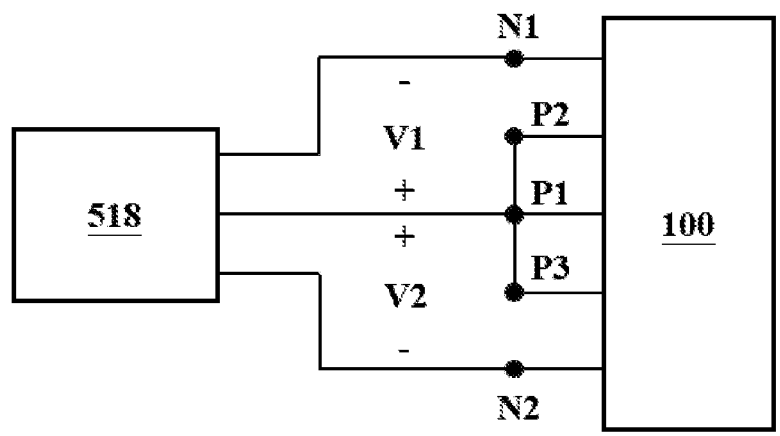

FIG. 8A is a schematic circuit diagram of an embodiment of the LED filament of the present invention. In this embodiment, LED filament 100 has four LED sections 402, 404, 406, 408 as shown in FIG. 8A. In detail, LED filament 100 of this embodiment is based on FIG. 8A and further includes LED section 408. The arrangement of LED sections 402, 404, 406 can refer to the above embodiments, it will not be repeated here. In this embodiment, the arrangement of LED section 408, which is identical or similar to that of LED section 402, 404 or 406, includes one or more LED chips. The LED chips are electrically connected in series. Three LED sections 402, 404, 406, 408 have respective current paths after they have been electrically connected (i.e. in parallel). In detail, cathodes of LED sections 408 and 404 are electrically connected together (i.e. cathodes of LED sections 402, 406 jointly serve as a second negative electrode N2). And anode of LED section 408 serves as a third positive electrode P3 of LED filament 100. In other words, In this embodiment, LED filament 100 further includes third positive electrode P3 formed by connecting to the anode of LED section 408 other than first positive electrode P1, second positive electrode P2, first negative electrode N1 and second negative electrode N2.

In this embodiment, under the arrangement of LED filament 100, the electrical relationship between LED filament 100 and the power module may be shown in FIGS. 8B to 8E to implement the current sharing drive control or sectional independent control. FIGS. 8B to 8E are four schematic views of electrical connections of four embodiments of the LED filament. Please refer to FIG. 8B first. In this embodiment, a first positive electrode P1, a second positive electrode P2 and a third positive electrode P3 of LED filament 100 are electrically connected together and jointly electrically connected to a first output terminal (also called "positive output terminal) of power module 518. First negative electrode N1 and second negative electrode N2 of LED filament 100 are electrically connected together and electrically connected to a second output terminal (also called "negative output terminal") of power module 518. Further refer to FIG. 8A, under the electrical relationship shown in FIG. 8B, LED sections 402, 404, 406, 408 can be deemed as being electrically connected to the output terminals of power module 518 in parallel. Thus, all LED sections 402, 404, 406, 408 are driven by driving voltage V1 between the first and second output terminals. Under a precondition of LED sections 402, 404, 406, 408 having identical or similar chips number and arrangement, the driving current from power module 518 will evenly dividedly flow to each of LED sections 402, 404, 406, 408. As a result, LED sections 402, 404, 406 can present approximately even intensity and/or color temperature. This arrangement is equivalent to that of the embodiment shown in FIGS. 5B, 6B and 7B.

Please further refer to FIG. 41C. In this embodiment, first positive electrode P1, second positive electrode P2 and third positive electrode P3 of LED filament 100 are electrically connected together and jointly electrically connected to the first output terminal (also called "first positive output terminal") of power module 518, first negative electrode N1 of LED filament 100 is electrically connected to second output terminal (also called "first negative output terminal") of power module 518, and second negative electrode N2 of LED filament 100 is electrically connected to the third output terminal (also called "second negative output terminal") of power module 518. Under such an arrangement, first positive electrode P1, second positive electrode P2 and third positive electrode P3 can be deemed as the same terminal. Thus, the whole circuit is equivalent to FIG. 5C. Related control manner, functions and effects can refer to the description of FIG. 5C. The arrangement of this embodiment can make a single filament have a two-stage dimming effect.

Figure 8D:
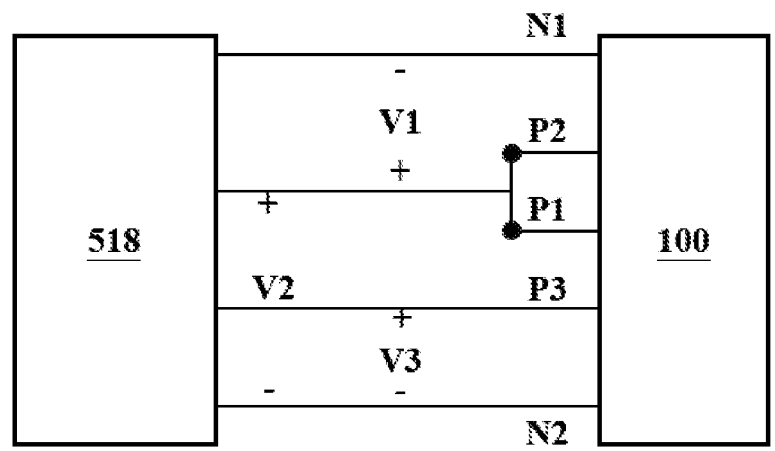

Please further refer to FIG. 8D. In this embodiment, first positive electrode P1 and second positive electrode P2 of LED filament 100 are electrically connected to the first output terminal (also called "first positive output terminal") of power module 518, third positive electrode P3 of LED filament 100 is electrically connected to the second output terminal (also called "second positive output terminal") of power module 518, first negative electrode N1 of LED filament 100 is electrically connected to the third output terminal (also called "first negative output terminal"), and second negative electrode N2 is electrically connected to the fourth output terminal (also called "second negative output terminal") of power module 518. Under such an arrangement, first positive electrode P1 and second positive electrode P2 can be deemed as the same terminal. Thus, the whole circuit is equivalent to FIG. 7D. Related control manner, functions and effects can refer to the description of FIG. 7D. The arrangement of this embodiment can make a single filament have a three-stage dimming effect.

Figure 8E:
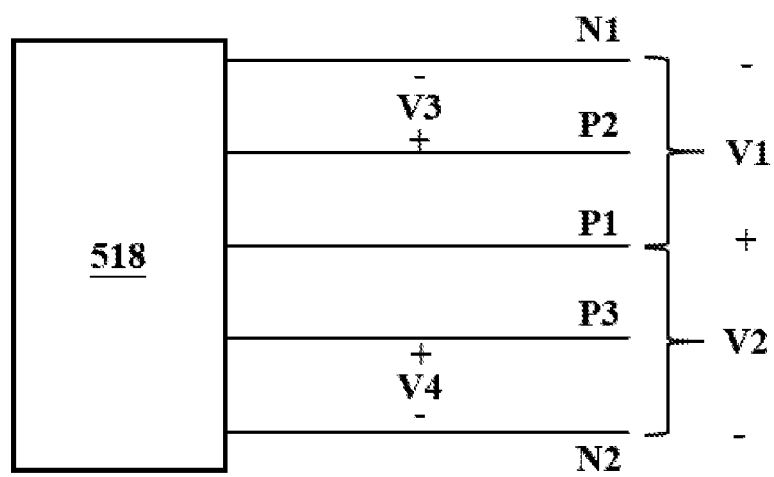

Please further refer to FIG. 8E. In this embodiment, first positive electrode P1 of LED filament 100 is electrically connected to the first output terminal (also called "first positive output terminal") of power module 518, second positive electrode P2 of LED filament 100 is electrically connected to the second output terminal (also called "second positive output terminal") of power module 518, third positive electrode P3 of LED filament 100 is electrically connected to the third output terminal (also called "third positive output terminal") of power module 518, first negative electrode N1 of LED filament 100 is electrically connected to the fourth output terminal (also called "first negative output terminal"), and second negative electrode N2 is electrically connected to the fifth output terminal (also called "second negative output terminal") of power module 518. Under such an arrangement, a driving voltage V1 is formed between the first output terminal and the fourth output terminal of power module 518, another driving voltage V2 is formed between the first output terminal and the fifth output terminal of power module 518, still another driving voltage V3 is formed between the second output terminal and the fourth output terminal of power module 518, and yet another driving voltage V4 is formed between the third output terminal and the fifth output terminal of power module 518. Further refer to FIG. 8A, under the electrical relationship shown in FIG. 8E, LED section 402 is electrically connected between the first and fourth terminals, LED section 404 is electrically connected between the first and fifth output terminals, LED section 406 is electrically connected between the second and fourth terminals, and LED section 408 is electrically connected between the third and fifth output terminals. Thus, LED sections 402, 404, 406, 408 can be deemed as being driven by driving voltages V1, V2, V3, V4, respectively. In such an arrangement, the driving currents provided by power module 518 to LED sections 402, 404, 406, 408 can be independently controlled by adjusting output voltages V2, V2, V3, V4 so as to make LED sections 402, 404, 406, 408 separately generate corresponding intensity and/or color temperature. The arrangement of this embodiment can make a single filament have a four-stage dimming effect.

In sum, according to the abovementioned embodiments, the description has clearly disclosed a strip of filament with multiple dimming controls by two, three or four LED sections. According to the description, a person having ordinary skill in the art can easily implements a strip of filament with multiple dimming control by five or more LED sections.

The invention has been described above in terms of the embodiments, and it should be understood by those skilled in the art that the present invention is not intended to limit the scope of the invention. It should be noted that variations and permutations equivalent to those of the embodiments are intended to be within the scope of the present invention. Therefore, the scope of the invention is defined by the scope of the appended claims.

What is claimed is:

1. An LED light bulb, consisting of:
    a bulb shell, including a layer of luminescent material integrally formed in the material of the bulb shell;
    a bulb base, connected with the bulb shell;
    a stem with a stand extending to a center of the bulb shell, disposed in the bulb shell;
    a flexible LED filament disposed in the bulb shell, at least a half of the flexible LED filament is around a center axis of the LED light bulb, where the center axis of the LED light bulb is coaxial with the axis of the stand, the flexible LED filament comprising:
    a plurality of LED sections, each of the LED sections include at least two LED chips, and the LED chips in each of the LED sections are electrically connected to each other through a wire;
    a plurality of conductive sections, located between two adjacent LED sections and electrically connected with the two adjacent LED sections, where the conductive section comprises a wavy convex structure, encirclingly disposed on a surface of the conductive section along the axial direction of the flexible LED filament;
    two conductive electrodes, disposed on the flexible LED filament correspondingly and electrically connected to each of the LED sections;
    a light conversion layer, covering the LED sections, the conductive sections and at least a part of each of the two conductive electrodes, such that each of the two electrodes is partially exposed respectively; and
    two conductive supports, each of the two conductive supports connected with the stem and the flexible LED filament;
    a driving circuit, electrically connected with both the two conductive supports and the bulb base; and
    a plurality of supporting arms respectively comprising two ends, an end of each of the supporting arm is connected to the stem and another end of each of the supporting arm is connected to the flexible LED filament;
    wherein anodes of LED sections are electrically connected together to serve as a first positive electrode P1 and/or a second positive electrode P2 of the flexible LED filament, cathodes of LED section serve as a first negative electrode N1 and/or a second negative electrode N2, respectively, where the positive electrode P1 and/or the second positive electrode P2, the first negative electrode N1 and/or the second negative electrode N2 are separately electrically connected to the driving circuit through the conductive supports.

2. The LED light bulb according to claim 1, wherein spacing between any two LED chips separately disposed in two different LED sections is greater than spacing between any two adjacent LED chips in a single LED section.

3. The LED light bulb according to claim 2, wherein each of the conductive section includes a conductor connecting the LED sections, and length of the wire being less than that of the conductor.

4. The LED light bulb according to claim 3, further comprising an auxiliary strip covered by the light conversion layer and arranged crossing the conductive section and extending along the axial direction of the flexible LED filament.

5. The LED light bulb according to claim 4, wherein the auxiliary strip is arranged cross both of the LED section and the conductive section.

6. The LED light bulb according to claim 3, further comprising an auxiliary strip disposed in a region corresponding to each of the conductive sections.

7. The LED light bulb according to claim 6, wherein each of the auxiliary strips extends through the corresponding conductive section and extends toward to adjacent LED sections along the axial direction of the LED filament.

8. The LED light bulb according to claim 7, wherein the conductor is made of metal coating or in conductive strip form.

9. The LED light bulb according to claim 8, wherein the light conversion layer comprises a plurality of particles, and any properties of the structure, material, effect or distribution density of the plurality of particles are different between the corresponding regions of the LED section and the conductive section.

10. The LED light bulb according to claim 9, wherein the light conversion layer corresponding to the conductive section comprises a plurality of light conducting particles.

11. The LED light bulb according to claim 10, wherein the plurality of light conducting particles are made of different sizes of the polymethyl methacrylate (PMMA) or resin.

12. The LED light bulb according to claim 11, wherein the positive electrode P1 of the LED filament is electrically connected to a first output terminal of the driving circuit, where the first and second negative electrodes N1, N2 of the flexible LED filament are electrically connected together and jointly electrically connected to a second output terminal of the driving circuit.

13. The LED light bulb according to claim 11, wherein the positive electrode P1 of the flexible LED filament is electrically connected to a first output terminal of the driving circuit, the first negative electrode N1 of the flexible LED filament is electrically connected to a second output terminal of the driving circuit, and the second negative electrode N2 of the flexible LED filament electrically connected to a third output terminal of the driving circuit.

14. The LED light bulb according to claim 13, wherein the second and third output terminals of the driving circuit can be electrically connected together through a resistor and either of the second and third output terminals of the driving circuit is electrically connected to a ground terminal.

15. The LED light bulb according to claim 11, wherein the first positive electrode P1 and the second positive electrode P2 of the flexible LED filament are electrically connected together and jointly electrically connected to a first output terminal of the driving circuit, the negative electrode N1 of the flexible LED filament is electrically connected to a second output terminal of the driving circuit.

16. The LED light bulb according to claim 11, wherein the positive electrode P1 of the flexible LED filament is electrically connected to a first output terminal of the driving circuit, the second positive electrode P2 of the flexible LED filament is electrically connected to a second output terminal of the driving circuit, and the negative electrode N1 of the flexible LED filament is electrically connected to a third output terminal of the driving circuit.

17. The LED light bulb according to claim 11, wherein the first positive electrode P1 and the second positive electrode P2 of the flexible LED filament are electrically connected together and jointly electrically connected to a first output terminal of the driving circuit, the first negative electrode N1 and the second negative electrode N2 of the flexible LED filament are electrically connected together and electrically connected to a second output terminal of the driving circuit.

18. The LED light bulb according to claim 11, wherein the first positive electrode P1 and the second positive electrode P2 of the flexible LED filament are electrically connected together and jointly electrically connected to a first output terminal of the driving circuit, the first negative electrode N1 of the flexible LED filament is electrically connected to a second output terminal of the driving circuit, and the second negative electrode N2 of the flexible LED filament is electrically connected to a third output terminal of the driving circuit.

19. The LED light bulb according to claim 18, wherein a spectral distribution of the LED light bulb is mainly between a wavelength range of about 400 nm to 800 nm, where there are three peak wavelengths P1, P2, P3 in wavelength ranges corresponding to the light emitted by the LED light bulb, the wavelength of the peak value P1 is between about 430 nm and 480 nm, the wavelength of the peak value P2 is between about 580 nm and 620 nm, and the wavelength of the peak value peak P3 is between about 680 nm and 750 nm, a light intensity of the peak P1 is less than that of the peak P2, and the light intensity of the peak P2 is less than a light intensity of the peak P3.

20. The LED light bulb according to claim 19, wherein points of the flexible LED filament in an xyz coordinates are defined as X, Y, and Z and satisfy a curve equation, an origin of xyz coordinates is at the stem top, an x-y plane of the xyz coordinates passes through a top of the stem and is perpendicular to the height direction, a z-axis of xyz coordinates is coaxial with stem, and the two conductive electrodes are symmetrically disposed at two sides of a y-axis of the xyz coordinates, the curve equation is:

$X = m1 * \cos(t*360)$, $Y = m2 * \sin(t*360)$, $Z = n * \cos(t*360*k)$, wherein, t is a variable between 0 and 1, the flexible LED filament varies along an x-direction, a y-direction, and a z-direction according to t; wherein, when X=0, a max value of |Y| is m2, and a max value of |Z| is n; wherein, when Y=0, a max value of |X| is m1, and a max value of |Z| is n; wherein, when Z=0, a max value of |X| is m1, and a max value of |Y| is m2; wherein m1 is a length in the x-direction, m2 is a length in the y-direction, n is a height of a highest point from the x-y plane in the z-direction, and k is a number of the highest point.

* * * * *